(12) United States Patent
Okahisa et al.

(10) Patent No.: US 11,929,452 B2
(45) Date of Patent: Mar. 12, 2024

(54) METHOD OF MANUFACTURING LIGHT-EMITTING DEVICE AND METHOD OF MANUFACTURING ILLUMINATION DEVICE

(71) Applicant: NICHIA CORPORATION, Anan (JP)

(72) Inventors: Tsuyoshi Okahisa, Tokushima (JP); Tomohito Shinomiya, Anan (JP); Daizo Kiba, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/085,045

(22) Filed: Dec. 20, 2022

(65) Prior Publication Data

US 2023/0121785 A1  Apr. 20, 2023

Related U.S. Application Data

(62) Division of application No. 17/024,323, filed on Sep. 17, 2020, now Pat. No. 11,575,073.

(30) Foreign Application Priority Data

Sep. 19, 2019 (JP) ................... 2019-170635

(51) Int. Cl.
*H01L 33/48* (2010.01)
*H01L 33/58* (2010.01)

(52) U.S. Cl.
CPC ............ *H01L 33/483* (2013.01); *H01L 33/58* (2013.01); *H01L 2933/0058* (2013.01)

(58) Field of Classification Search
CPC .................. H01L 33/483; H01L 33/58; H01L 2933/0058
See application file for complete search history.

(56) References Cited

U.S. PATENT DOCUMENTS

2006/0291245 A1  12/2006  Shimada
2008/0198604 A1  8/2008  Kim et al.
(Continued)

FOREIGN PATENT DOCUMENTS

CN       202403094 U    8/2012
CN       103162164 A    6/2013
(Continued)

OTHER PUBLICATIONS

Non-Final Office Action issued in U.S. Appl. No. 17/024,323 dated May 24, 2022.
(Continued)

*Primary Examiner* — Jay C Chang
*Assistant Examiner* — Mikka Liu
(74) *Attorney, Agent, or Firm* — Foley & Lardner LLP

(57) ABSTRACT

A method for manufacturing a light-emitting device includes: forming a cover, which comprises: sandwiching a fixing member by a molding device, injecting a light-transmissive material into a space defined in the molding device, and hardening or curing the injected light-transmissive material, wherein the formed cover comprises an upper portion, a sidewall, and a recess, the cover being integrated with the fixing member such that the fixing member projects from a part of an outer lateral surface of the sidewall; disposing a light-transmissive member on a light extraction surface of a light-emitting element to be disposed on a substrate; and disposing the cover so that the light-emitting element is housed in the recess. The fixing member is formed of a material that is deformable due to a pressing force generated in the event of an engagement with a counterpart member.

7 Claims, 17 Drawing Sheets

(56) References Cited

U.S. PATENT DOCUMENTS

| | | |
|---|---|---|
| 2010/0328958 A1 | 12/2010 | Zhang |
| 2011/0228528 A1 | 9/2011 | Yang et al. |
| 2012/0063143 A1 | 3/2012 | Park et al. |
| 2013/0126927 A1* | 5/2013 | Iguchi .................. H01L 33/60 257/98 |
| 2013/0223064 A1 | 8/2013 | Lee et al. |
| 2016/0079112 A1 | 3/2016 | Itonaga et al. |
| 2017/0067621 A1 | 3/2017 | Anselm et al. |
| 2020/0083413 A1* | 3/2020 | Ao ........................ H01L 33/52 |
| 2021/0071837 A1 | 3/2021 | Owoc et al. |
| 2021/0071843 A1 | 3/2021 | Palm et al. |
| 2021/0088190 A1 | 3/2021 | Okahisa et al. |

FOREIGN PATENT DOCUMENTS

| | | |
|---|---|---|
| CN | 203348992 U | 12/2013 |
| CN | 110230793 A | 9/2019 |
| JP | 2008-071651 A | 3/2008 |
| JP | 2009-176579 A | 8/2009 |
| JP | 2010-040801 A | 2/2010 |
| JP | 2010-103404 A | 5/2010 |
| JP | 2012-099358 A | 5/2012 |
| JP | 2013-120646 A | 6/2013 |
| JP | 2015-128025 A | 7/2015 |
| JP | 2015-216217 A | 12/2015 |
| JP | 2017-027914 A | 2/2017 |
| JP | 2017-045698 A | 3/2017 |

OTHER PUBLICATIONS

Notice of Allowance issued in U.S. Appl. No. 17/024,430 dated Oct. 8, 2021.

Notice of Allowance issued in U.S. Appl. No. 17/024,323 dated Oct. 6, 2022.

Requirement for Restriction issued in U.S. Appl. No. 17/024,323 dated Mar. 16, 2022.

Supplemental Notice of Allowability issued in U.S. Appl. No. 17/024,430 dated Dec. 1, 2021.

Supplemental Notice of Allowability issued in U.S. Appl. No. 17/024,430 dated Dec. 22, 2021.

Non-Final Office Action issued in U.S. Appl. No. 17/024,430 dated May 17, 2021.

* cited by examiner

METHOD OF MANUFACTURING LIGHT-EMITTING DEVICE AND METHOD OF MANUFACTURING ILLUMINATION DEVICE

CROSS-REFERENCE TO RELATED APPLICATIONS

The present application is a divisional application of the U.S. patent application Ser. No. 17/024,323, filed on Sep. 17, 2020, which claims priority under 35 U.S.C. § 119 to Japanese Patent Application No. 2019-170635, filed Sep. 19, 2019. The contents of these applications are incorporated herein by reference in their entireties.

BACKGROUND

The present disclosure relates to a light-emitting device, an illumination device, and methods for manufacturing them.

Japanese Patent Publication No. 2010-103404 discloses an illumination device including an LED element, a package with lead electrodes on which the LED element is mounted, a cover member attached to the package and having a light-transmissive part. Japanese Patent Publication No. 2010-040801 discloses a light-emitting device including: an LED lamp including an LED element mounted on a circuit board and sealed by a resin; and a cover having a light focusing means that focuses light emitted from the LED element.

SUMMARY

There is room for improvement in reducing a thickness of the above-described devices.

An object of certain embodiments described in the present disclosure is to provide a light-emitting device and an illumination device that can be reduced in thickness, and to provide methods for manufacturing them.

A light-emitting device according to an embodiment of the disclosure includes: a substrate; a light-emitting element disposed on the substrate; a light-transmissive member disposed on a light extraction surface of the light-emitting element; a cover that covers the light-emitting element with a gap therebetween, the cover including an upper portion, a sidewall extending along a peripheral edge of the upper portion, and a recess defined by the upper portion and the sidewall, the upper portion being transmissive to light emitted from the light-emitting element, the sidewall having an outer lateral surface; and a fixing member arranged on at least a part of the outer lateral surface of the sidewall of the cover. The fixing member is formed of a material that is deformable due to a pressing force generated in the event of an engagement with a counterpart member.

An illumination device according to an embodiment of the disclosure includes: the above-described light-emitting device; and a casing having a through-hole, the casing being the counterpart member. The light-emitting device is fixed to the casing by the fixing member of the light-emitting device being in contact with an inner surface of the through-hole of the casing in a state of being deformed.

A method for manufacturing a light-emitting device according to an embodiment of the disclosure includes: forming a cover by sandwiching a fixing member by a molding device and injecting a light-transmissive material into a space defined in the molding device and by hardening or curing the injected light-transmissive material, the cover including an upper portion, a sidewall extending along a peripheral edge of the upper portion, and a recess defined by the upper portion and the sidewall, the cover being integrated with the fixing member such that the fixing member projects from a part of an outer lateral surface of the sidewall; disposing a light-transmissive member on a light extraction surface of a light-emitting element to be disposed on a substrate; and disposing the cover so that the light-emitting element is housed in the recess. The fixing member is formed of a material that is deformable due to a pressing force generated in the event of an engagement with a counterpart member.

A method for manufacturing a light-emitting device according to an embodiment of the disclosure includes: forming a cover by injecting a light-transmissive material into a space defined in a molding device and hardening or curing the injected light-transmissive material, the cover including an upper portion, a sidewall extending along a peripheral edge of the upper portion, and a recess defined by the upper portion and the sidewall; disposing a fixing member an outer lateral surface of the sidewall such that the fixing member projects from a part of the outer lateral surface of the sidewall; disposing a light-transmissive member on a light extraction surface of a light-emitting element to be disposed on a substrate; and disposing the cover so that the light-emitting element is housed in the recess. The fixing member is made of a material that is deformable due to a pressing force generated in the event of an engagement with a counterpart member.

A method for manufacturing a light-emitting device according to an embodiment of the disclosure includes: forming a cover by injecting a light-transmissive material into a space defined in a molding device and hardening or curing the injected light-transmissive material, the cover including an upper portion, a sidewall extending along a peripheral edge of the upper portion, and a recess defined by the upper portion and the sidewall; disposing a fixing member that covers an outer lateral surface of the sidewall; disposing a light-transmissive member on a light extraction surface of a light-emitting element to be disposed on a substrate; and disposing the cover so that the light-emitting element is housed in the recess. The fixing member is formed of a soft material that is deformable due to a pressing force generated in the event of an engagement with a counterpart member.

A method for manufacturing an illumination device according to an embodiment of the present disclosure includes: manufacturing a light-emitting device using one of the above-described methods for manufacturing a light emitting device; and fixing the light-emitting device to a casing having a through-hole and constituting the counterpart member so that the fixing member of the light-emitting device comes into contact with an inner surface of the through-hole of the casing in a state of being deformed.

A light-emitting device and an illumination device according to the present disclosure can be reduced in thickness thereof.

A method for manufacturing a light-emitting device according to the present disclosure and a method for manufacturing an illumination device according to the present disclosure allow for reducing the thicknesses of the light-emitting device and illumination device to be manufactured.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION

Figure 1A:
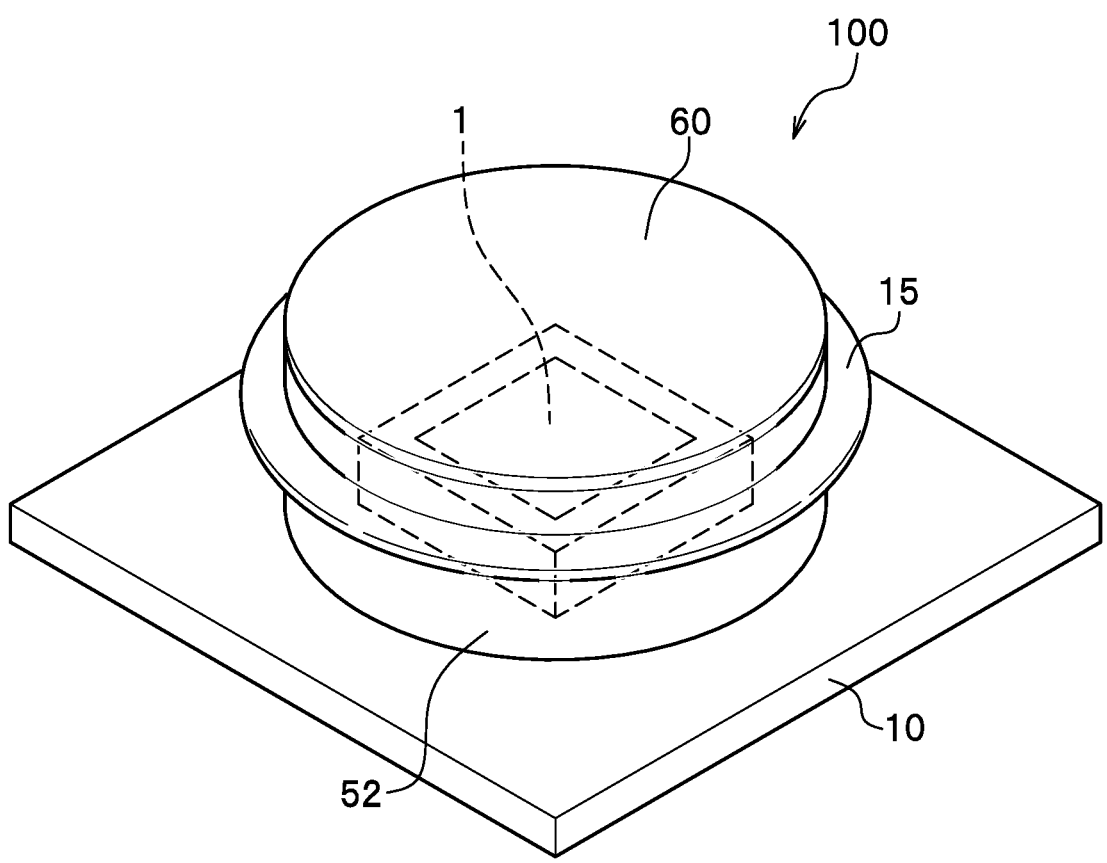
FIG. 1A is a perspective view schematically illustrating the structure of the light-emitting device according to a first embodiment.

Hereinafter, a description will be given of light-emitting devices and illumination devices and manufacturing methods thereof according to embodiments of the present disclosure. It should be appreciated, however, that the embodiments described below are illustrations of light-emitting devices and illumination devices and methods for producing them to give a concrete form to technical ideas of the disclosure, and the present invention is not limited to the embodiments described below. Unless otherwise specified, the dimensions, materials, shapes, relative positions, and the like of the constituent components described in the embodiments below are not intended to limit the scope of the invention thereto, and are merely illustrative. Furthermore, the sizes, positional relations, and so forth of the constituent members shown in the drawings may be exaggerated for the sake of clarity. In the following description, members that are the same or analogous are given the same name or reference sign, and duplicative detailed descriptions are appropriately omitted.

First Embodiment

Light-Emitting Device

Figure 1B:
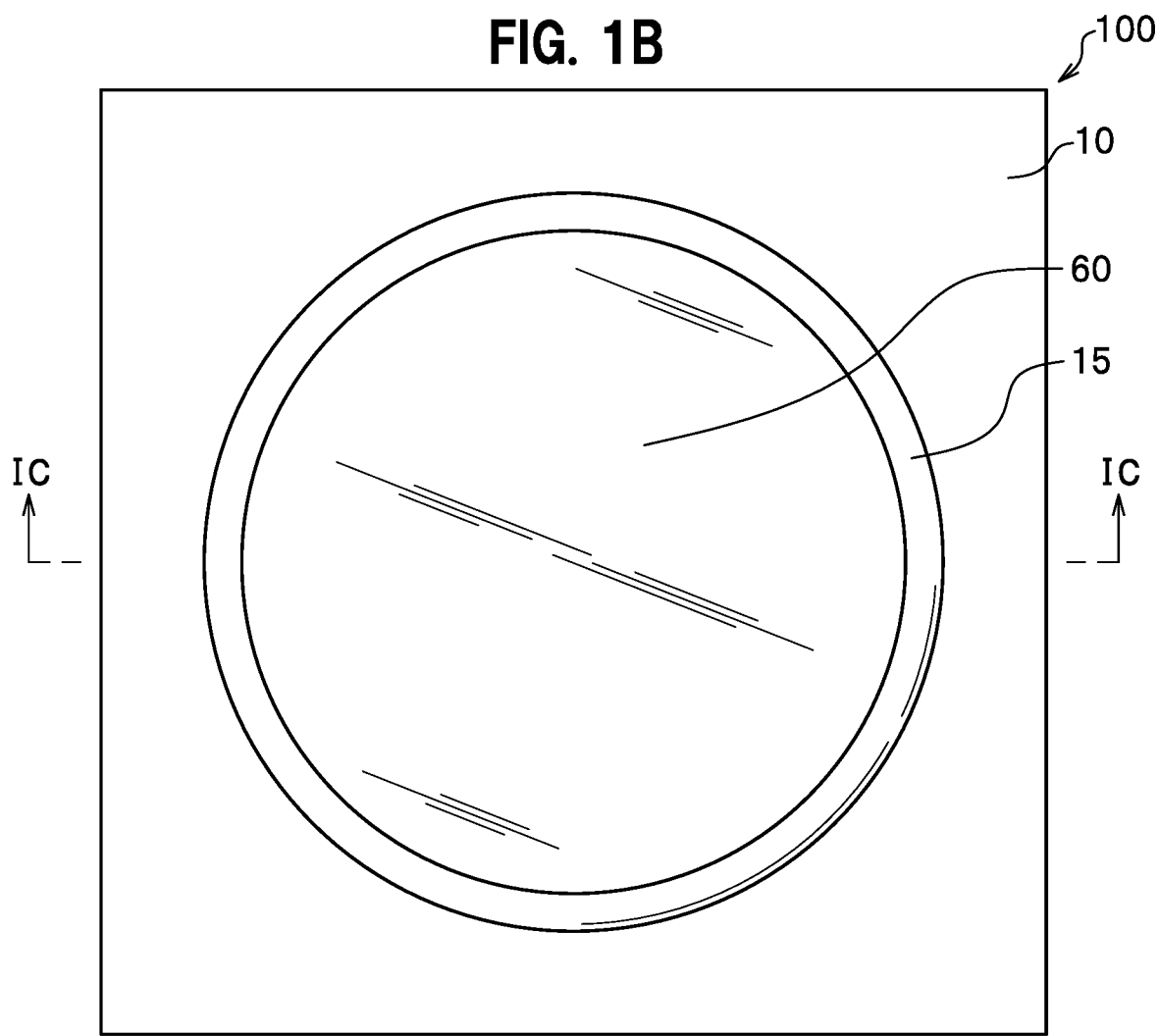
FIG. 1B is a plan view schematically illustrating the structure of the light-emitting device according to the first embodiment.
Figure 1C:
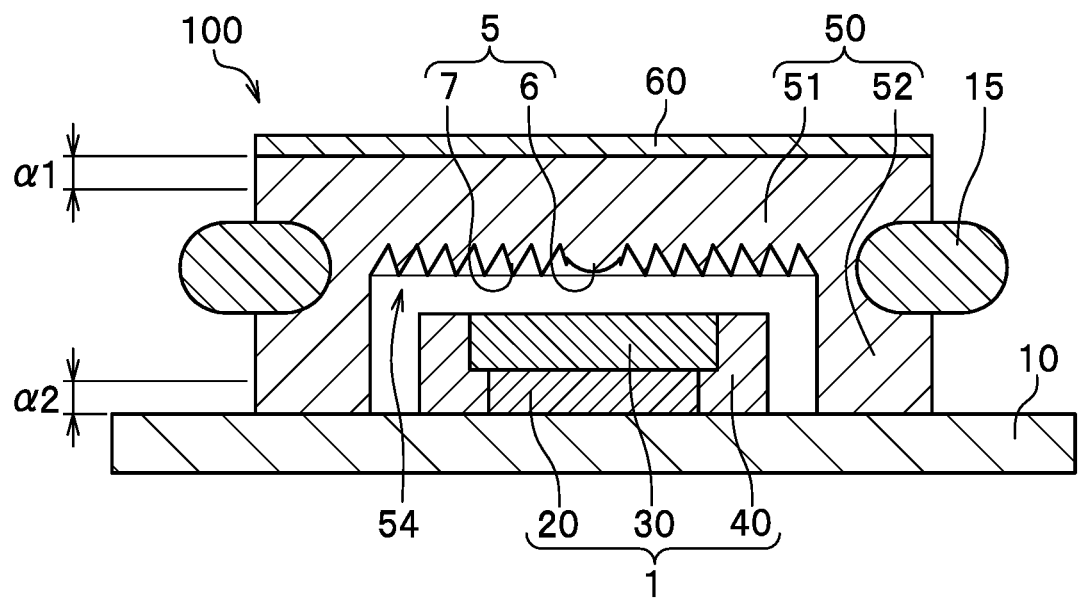
FIG. 1C is a schematic cross-sectional view taken along line IC-IC in FIG. 1B.
Figure 1D:
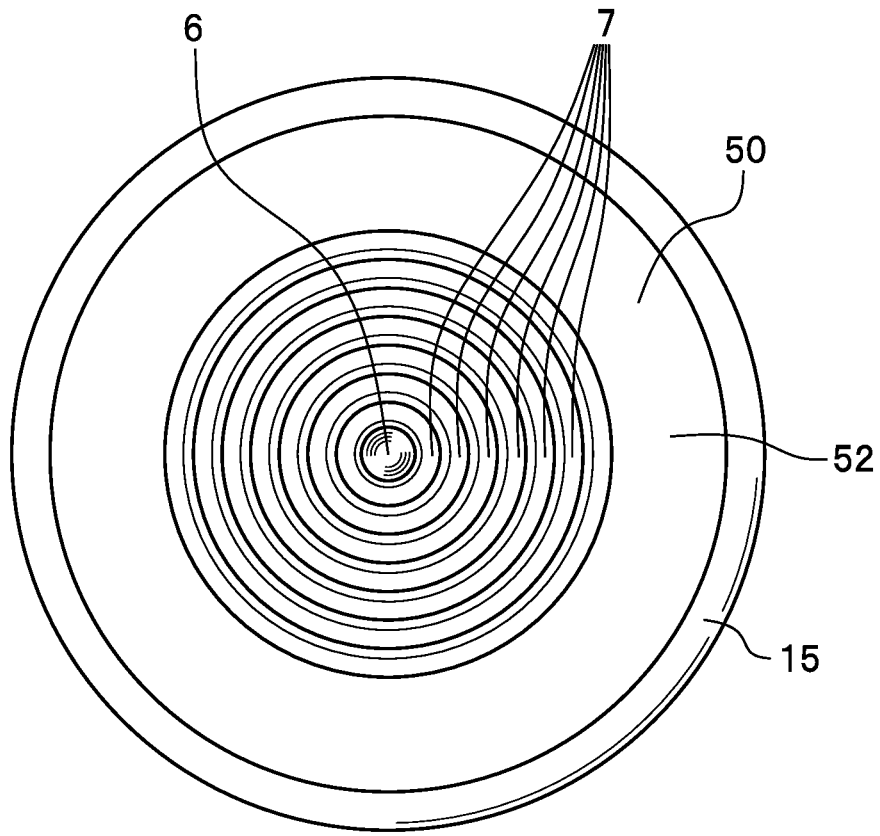
FIG. 1D is a plan view of an upper portion of a cover of the light-emitting device according to the first embodiment, as seen from a side of the cover facing a light-emitting element of the light-emitting device.
Figure 1E:
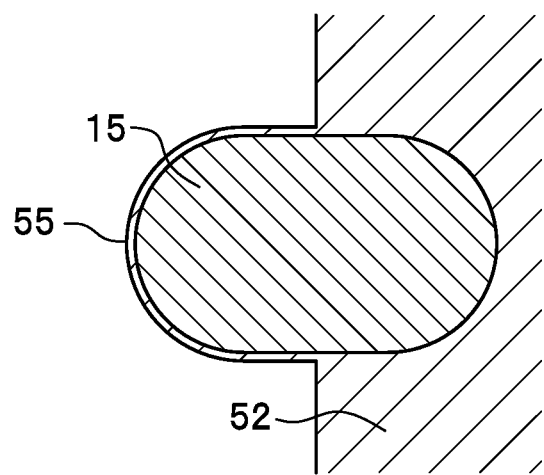
FIG. 1E is a partially enlarged view of FIG. 1C.

FIG. 1A is a perspective view schematically illustrating the structure of the light-emitting device according to a first embodiment. FIG. 1B is a plan view schematically illustrating the structure of the light-emitting device according to the first embodiment. FIG. 1C is a schematic cross-sectional view taken along line IC-IC in FIG. 1B. FIG. 1D is a plan view of an upper portion of a cover of the light-emitting device according to the first embodiment, as seen from a side of the cover facing a light-emitting element of the light-emitting device. FIG. 1E is a partially enlarged view of FIG. 1C.

The light-emitting device 100 according to the first embodiment includes: a substrate 10; a light-emitting element 20 disposed on the substrate 10; a light-transmissive member 30 disposed on a light extraction surface of the light-emitting element 20; a cover 50 that covers the light-emitting element 20 with a gap between the cover and the light-emitting element; and a fixing member 15. The cover 50 has an upper portion 51 and a sidewall 52. The upper portion 51 transmits light emitted from the light-emitting element 20. The side wall 52 extends along a peripheral edge of the upper portion 51. The fixing member 15 is provided on at least a part of an outer lateral surface of a sidewall 52 of the cover 50 lateral surface. The cover 50 has a recess 54 whose bottom is defined by the upper portion 51 and whose side is defined by the sidewall 52. The fixing member 15 is made of a soft material that is deformable due to a pressing force generated in the event of an engagement with a counterpart member.

The light-emitting device 100 includes, as main components: the substrate 10; the light-emitting element 20; the light-transmissive member 30; a light-reflective member 40; the cover 50; the fixing member 15; and further a hard-coat layer 60.

Hereinafter, configuration of the light-emitting device 100 will be described.

Substrate

The substrate 10 is a member on which the light-emitting element 20 is disposed and is preferably provided with wiring disposed on a front surface of and/or inside the substrate 10.

The substrate 10 is electrically connected with the light-emitting element 20 by connecting the wiring with a pair of positive and negative electrodes of the light-emitting element 20 via a conductive bonding member.

The substrate 10 is preferably formed of a material that has insulation properties, hardly transmits light emitted from the light-emitting element 20 and/or external light, and has a certain strength. Specifically, the substrate 10 can be formed of a ceramic such as alumina, aluminum nitride, and mullite, or formed of a resin such as a phenolic resin, epoxy resin, polyimide resin, bismaleimide triazine (BT) resin, or polyphthalamide. The substrate 10 may be a glass epoxy substrate, a metal substrate, or a partially insulated metal substrate.

Light-Emitting Element

The light-emitting element 20 is disposed on the substrate 10. The light-emitting element 20 has the light extraction surface and a lower surface opposite to the light extraction surface, preferably has the pair of positive and negative electrodes on the lower surface, and is preferably flip-chip mounted on the substrate 10. Although the light-emitting element 20 normally has the shape of a quadrilateral in plan view, it may have the shape of a circle, oval, triangle, hexagon or any other polygon in plan view. In addition, although the element structure 1 made up of the light-emitting element 20, the light-transmissive member 30, and the light-reflective member 40 also normally has the shape of a quadrilateral in plan view, it may have the shape of a circle, oval, triangle, hexagon or any other polygon in plan view.

The light-emitting element 20 is preferably formed of a semiconductor, examples of which include Group III-V compound semiconductors and Group II-VI compound semiconductors. As the semiconductor, a nitride-based semiconductor such as $In_XAl_YGa_{1-X-Y}N$ ($0 \leq X$, $0 \leq Y$, $X+Y \leq 1$) is preferably used. InN, AlN, GaN, InGaN, AlGaN, InGaAlN and the like can also be used.

Light-Transmissive Member

The light-transmissive member 30 is disposed on the upper surface, i.e., the light extraction surface, of the light-emitting element 20. The light-transmissive member 30 protects the light-emitting element 20 from external forces, dust, moisture, and the like, and improves the heat resistant properties, weather resistant properties, and light resistant properties of the light-emitting element 20. Examples of the material of the light-transmissive member 30 include thermosetting resins, thermoplastic resins, modified resins of these resins, and hybrid resins that contain one or more of these resins. Specifically, the examples include epoxy resins, modified epoxy resins, silicone resins, modified silicone resins, and hybrid silicone resins.

The light-transmissive member 30 preferably contains a wavelength conversion material, such as a phosphor that converts the wavelength of light from the light-emitting element 20, to adjust the color of the light to be emitted. Preferably, a cerium-activated yttrium aluminum garnet (YAG)-based fluorescent material is used as the phosphor. The light-transmissive member 30 may contain a filler (e.g., a diffusing agent, a coloring agent, or the like). Preferable examples of the filler include silica, titanium oxide, zirconium oxide, magnesium oxide, glass, a crystal or sintered body of a phosphor, and a sintered body of a phosphor and an inorganic binding material.

Light-Reflective Member

The light-reflective member 40 covers the lateral surfaces of the light-emitting element 20 and the lateral surfaces of the light-transmissive member 30 but does not cover the upper surface of the light-transmissive member 30. The light-reflective member 40 serves to improve the light extraction efficiency and is preferably formed of a synthetic resin such as a silicone resin containing a white pigment. Preferably, the white pigment is one selected from the group consisting of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and silicon oxide, or is a combination of two or more materials selected from the foregoing group.

Cover

The cover 50 covers the light-emitting element 20 with a gap therebetween. The cover 50 includes the upper portion 51 allowing the light emitted from the light-emitting element 20 to transmit; the sidewall 52, which extends along a peripheral edge of the upper portion 51; and the recess 54, whose bottom is defined by the upper portion 51 and whose side is defined by the sidewall 52, and which is open toward the substrate 10.

The upper portion 51 is located opposed to the light-emitting element 20 with a gap therebetween, and serves to refract and transmit the light from the light-emitting element 20 to be emitted within a desired angle of view. The external shape of the upper portion 51 is preferably a circle or oval in plan view, or may be a polygon such as a quadrilateral or hexagon.

The upper portion 51 has a lower surface opposed to the light-emitting element 20. The lower surface preferably includes a Fresnel lens surface 5 composed of a plurality of annular projections 7. The upper portion 51 may be a convex lens or a concave lens. The Fresnel lens surface 5 of the upper portion 51 preferably includes: a central projection 6 that is convex toward the light-emitting element 20; and a plurality of annular projections 7 formed around and concentrically with the central projection 6 being convex toward the light-emitting element 20. Preferably, each of the plurality of annular projections 7 is located concentrically with the central projection 6 in plan view and is formed in an annular shape following the shape of the central projection 6. More specifically, when the central projection 6 is circular in plan view, each of the plurality of projections 7 is formed in the shape of a circular ring in plan view; and when the central projection 6 is rectangular in plan view, each of the plurality of projections 7 is formed in the shape of a rectangular ring in plan view. Preferably, each of the plurality of projections 7 is formed to provide the function of the Fresnel lens surface 5, which refracts the light from the light-emitting element 20. Preferably, the Fresnel lens surface is dimensioned to include the element structure 1 completely in plan view.

The upper portion 51 has a flat configuration on the opposite side of the Fresnel lens surface 5 of the upper portion 51. As an example, the sidewall 52 is formed continuously with the lateral side of the upper portion 51 in a cylindrical shape. Preferably, the cover 50 is fixed to the substrate 10 by the lower surface of the sidewall 52 being fixed to the upper surface of the substrate 10 with an adhesive member therebetween. Here, the adhesive member may be a known adhesive material such as an adhesive tape. As an example, the upper portion 51 and the sidewall 52 of the cover 50 are monolithically formed by processing a single member. Incidentally, the upper portion 51 may be formed of a light-transmissive resin or a glass and the sidewall 52 may be formed of a resin (a resin different from that of the upper portion 51).

Preferably, the upper portion 51 is harder than the fixing member 15. With this configuration, the upper portion 51 can be inhibited from being deformed. In addition, the sidewall 52 is preferably harder than the fixing member 15. With this configuration, the sidewall 52 can be inhibited from being deformed. It is preferable that the upper portion 51 and the sidewall 52 be harder than the fixing member 15, because the cover 50 can be inhibited from being deformed.

Examples of the material of the upper portion 51 include thermosetting resins, thermoplastic resins, modified resins of these resins, and hybrid resins that contain one or more of these resins. Specifically, the examples include epoxy resins, modified epoxy resins, silicone resins, modified silicone resins, hybrid silicone resins, and polycarbonate resins. Examples of the material of the upper portion 51 further include hybrid glasses. Examples of the material of the sidewall 52 include thermosetting resins, thermoplastic resins, modified resins of these resins, and hybrid resins that contain one or more of these resins. Specifically, the examples include epoxy resins, modified epoxy resins, silicone resins, modified silicone resins, hybrid silicone resins, and polycarbonate resins. Examples of the material of the sidewall 52 further include hybrid glasses.

Preferably, the cover 50 is constituted by a hard member that is harder than the below-described soft material. Examples of the material of the hard member include polycarbonate resins, epoxy resins, and hybrid glasses. Preferably, the hard member is formed of a polycarbonate resin. Polycarbonate resins are preferable in terms of the easiness in processing and appropriate hardness.

Preferably, the cover 50 is formed of a resin, and the fixing member 15 is formed of a resin softer than the resin of the cover 50. With this configuration, the cover 50 is easy to fabricate and the light-emitting device 100 is easily engaged with a casing 70.

Fixing Member

The fixing member 15 is disposed so as to project from a part of the outer lateral surface of the sidewall 52 of the cover 50. The fixing member 15 is partially inserted into the sidewall 52.

The fixing member 15 is formed of a soft material that is deformable due to a pressing force generated in the event of an engagement with a counterpart member. Hear, an example of the counterpart member is a casing 70 used in a mobile phone. The feature of the fixing member 15 being deformable due to a pressing force allows the fixing member 15 to be deformed in such a way as to fix the light-emitting device 100 to the casing 70 when the cover 50 is fitted in a through-hole 71 of the casing 70. The fixing member 15 is deformed such that, when the original height of the fixing member 15 from the sidewall 52 is 1, the height from the sidewall 52 decreases preferably to a height 0.2 to 0.9 times the original height, or more preferably to a height 0.4 to 0.7 times the original height. Such deformation enhances the fixation strength of the cover 50 when it is fitted into the casing 70.

The light-emitting device 100 being fixed to the casing 70 using the fixing member 15 makes it possible to reduce the thickness of the light-emitting device and the illumination device.

The fixing member 15 may be covered by a thin film 55 formed of the same material of the sidewall 52 of the cover 50. The thin film 55 is described in the below-described manufacturing method in detail.

Hereinbelow, the fixing member 15 is further described taking the casing 70 as an example of the counterpart member.

Examples of the material of the fixing member 15 include thermosetting resins, thermoplastic resins, modified resins of these resins, and hybrid resins that contain one or more of these resins. Specifically, the examples include epoxy resins, modified epoxy resins, silicone resins, modified silicone resins, and hybrid silicone resins. Examples of the material of the fixing member 15 further include hybrid glasses.

The soft material used for the fixing member 15 is preferably a silicone resin. Silicone resins are preferable because they are easily deformed due to a pressing force generated in the event of an engagement with the casing 70 and have good light resistant properties and good heat resistant properties.

The fixing member 15 projecting from the outer lateral surface of the sidewall 52 has a distal end portion having an arc-shaped cross section. This configuration allows the cover 50 to slide smoothly when it is fitted into the casing 70, and thereby the cover 50 is easily fitted into the casing 70. However, the cross-sectional shape of the fixing member 15 can be any other shape so long as the fixing member 15 is deformed due to a pressing force generated in the event of an engagement with the casing 70 and as a result the light-emitting device 100 is fixed to the casing 70. For example, the cross-sectional shape of the fixing member 15 projecting from the outer lateral surface of the sidewall 52 may be a quadrilateral, triangle, half circle, or half oval.

The fixing member 15 preferably extends continuously along the outer lateral surface of the sidewall 52 in a loop shape in plan view. With this configuration, the light-emitting device 100 is easily engaged with the casing 70 in a stable manner. In addition, it is easy to form the fixing member 15 on the outer lateral surface of the sidewall 52 when fabricating the light-emitting device 100.

The fixing member 15 is preferably disposed at such a height position relative to the height of the sidewall 52 that (i) the height position is lower than an uppermost area α1 extending downward from the upper end of the outer lateral surface of the sidewall 52 by a length of 10% of the height of the sidewall 52, and (ii) the height position is higher than a lowermost area α2 extending upward from the lower end of the outer lateral surface of the sidewall 52 by a length of 10% of the height of the sidewall 52. With this configuration, the light-emitting device 100 is easily engaged with the casing 70 in a stable manner.

Hard-Coat Layer

The hard-coat layer 60 covers the upper surface of the cover 50. The hard-coat layer 60 is a member that is harder than the cover 50. The hard-coat layer 60 has light-transmissive properties and continuously covers the upper surface of the upper portion 51 of the cover 50 and the upper surface of the sidewall 52 of the cover 50. The light-emitting device 100 restrains the deformation of the cover 50 by being provided with the hard-coat layer 60. Providing the hard-coat layer 60 protects the upper surface of the cover 50 from external forces, dust, moisture or the like, and inhibits the upper surface from being scratched.

Examples of the material of the hard-coat layer 60 include thermosetting resins, thermoplastic resins, modified resins of these resins, and hybrid resins that contain one or more of these resins. Specifically, the examples include acrylic resins, epoxy resins, modified epoxy resins, silicone resins, modified silicone resins, hybrid silicone resins, and polycarbonate resins.

Operation of Light-Emitting Device

Next, a description will be given of the operation of the light-emitting device 100.

When the light-emitting device 100 is driven, the light-emitting element 20 is supplied with current from an external power source. As a result, the light-emitting element 20 emits light. The light emitted by the light-emitting element 20 includes light that travels upward, passes through the light-transmissive member comes out of the light-transmissive member 30, and enters the upper portion 51 of the cover 50. The light emitted by the light-emitting element 20 includes light that travels downward, reflects back off the substrate 10, passes through the light-transmissive member 30, comes out of the light-transmissive member 30, and enters the upper portion 51 of the cover 50. The light emitted by the light-emitting element 20 includes light that travels in a lateral direction, reflects back off the light-reflective member 40, passes through the light-transmissive member 30, comes out of the light-transmissive member 30, and enters the upper portion 51 of the cover 50. In the upper portion 51 of the cover 50, the light coming from a central portion of the element structure 1 enters the central projection 6 and exits in the optical axis direction and in the focusing directions. In addition, in the upper portion 51 of the cover 50, the light coming from the element structure 1 other than the central portion thereof enters the projections 7 of the Fresnel lens surface 5 and is refracted at an angle within the desired angle of view and exits from the upper portion 51. That means, the upper portion 51 of the cover 50 causes the light incident on the projections 7 to be refracted and exit from the upper portion 51, to thereby improve the light emission efficiency in the desired angle of view. In this way, the light emitted by the light-emitting element 20 is extracted to the outside of the light-emitting device 100.

Method for Manufacturing Light-Emitting Device

Next, a description will be given of an example of a method for manufacturing the light-emitting device 100.

Figure 2:
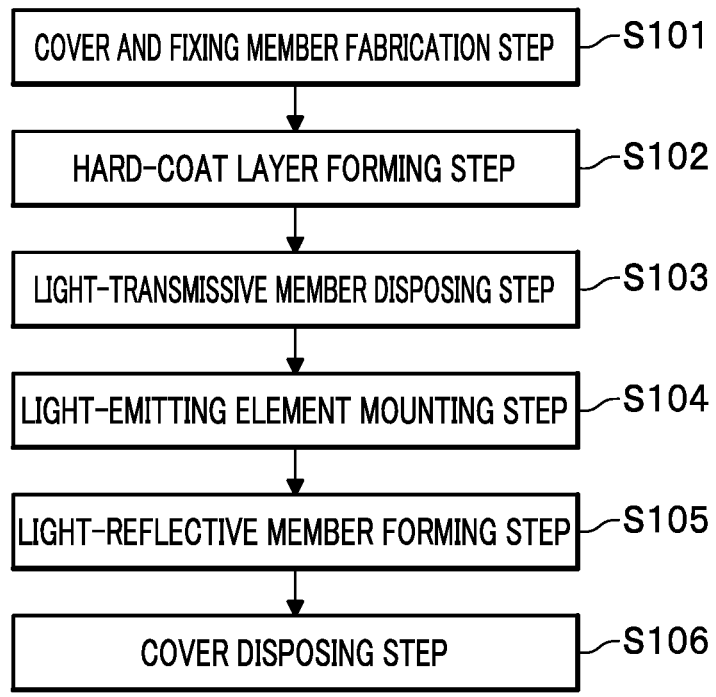
FIG. 2 shows a flowchart of a method for manufacturing the light-emitting device according to the first embodiment.
Figure 3A:
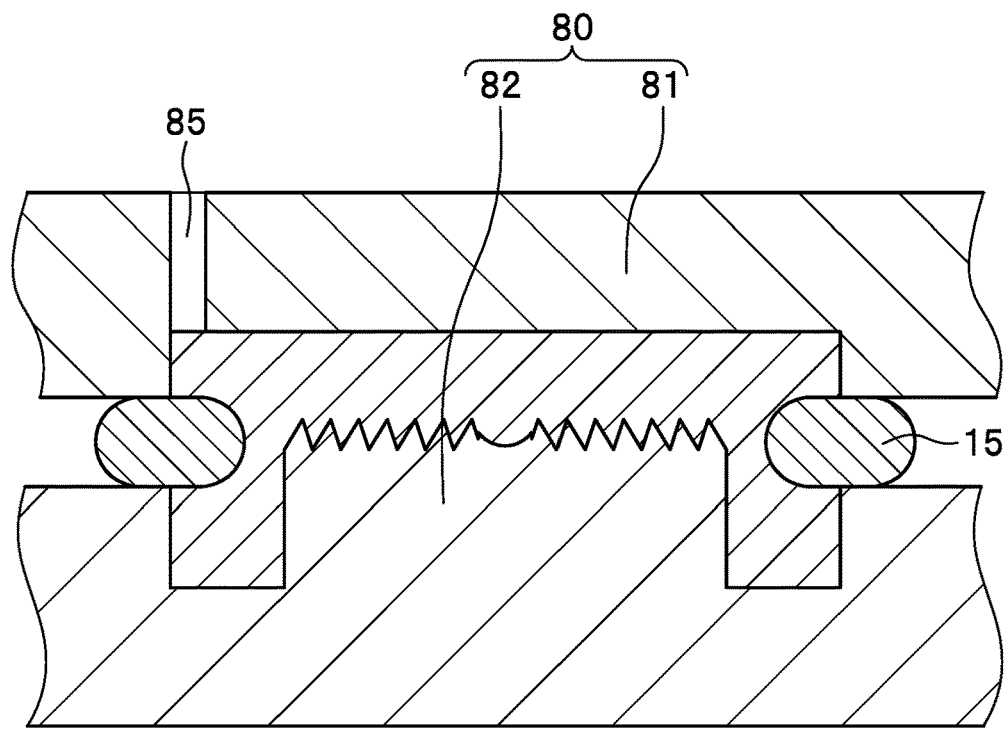
FIG. 3A is a cross-sectional view illustrating a step of fabricating a cover and a fixing member in the method for manufacturing the light-emitting device according to the first embodiment.
Figure 3B:
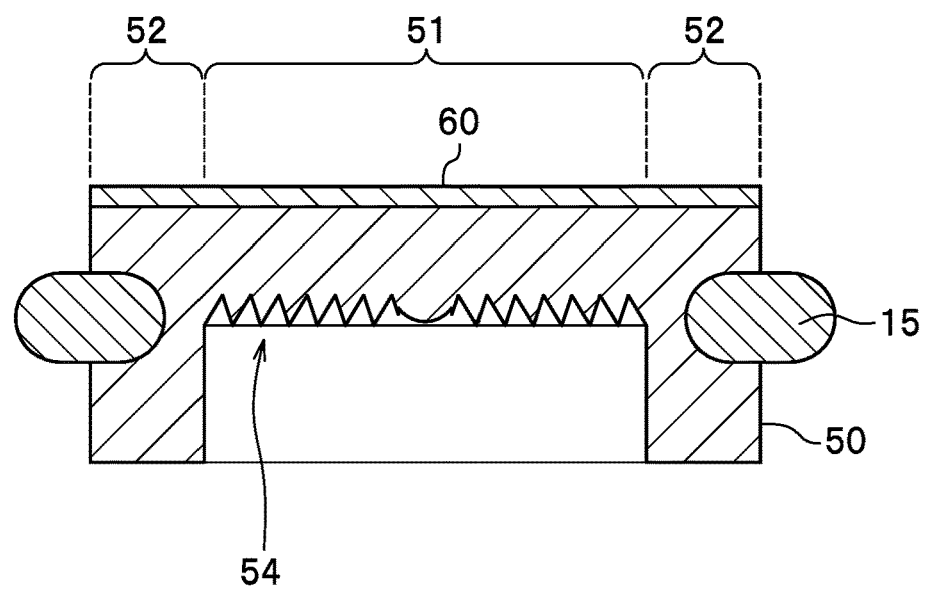
FIG. 3B is a cross-sectional view illustrating a step of forming a hard-coat layer in the method for manufacturing the light-emitting device according to the first embodiment.
Figure 3C:
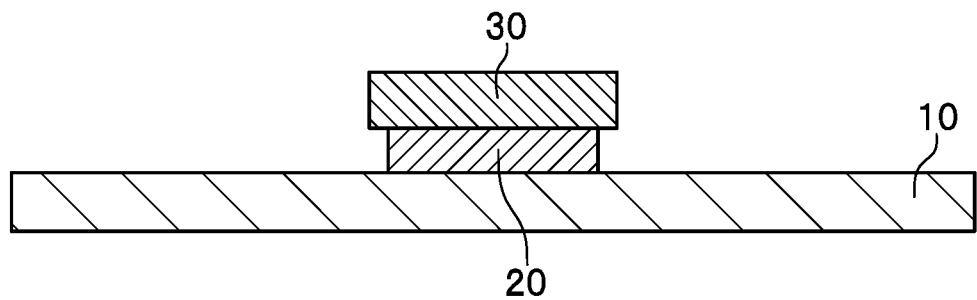
FIG. 3C is a cross-sectional view illustrating a step of disposing a light-emitting element on a substrate in the method for manufacturing the light-emitting device according to the first embodiment.
Figure 3D:
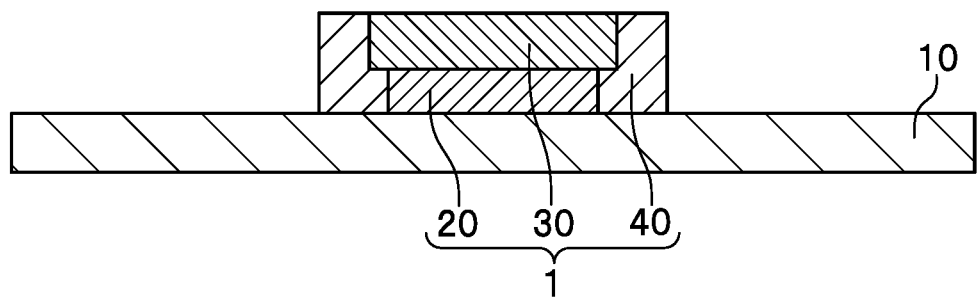
FIG. 3D is a cross-sectional view illustrating a step of forming a light-reflective member in the method for manufacturing the light-emitting device according to the first embodiment.
Figure 3E:
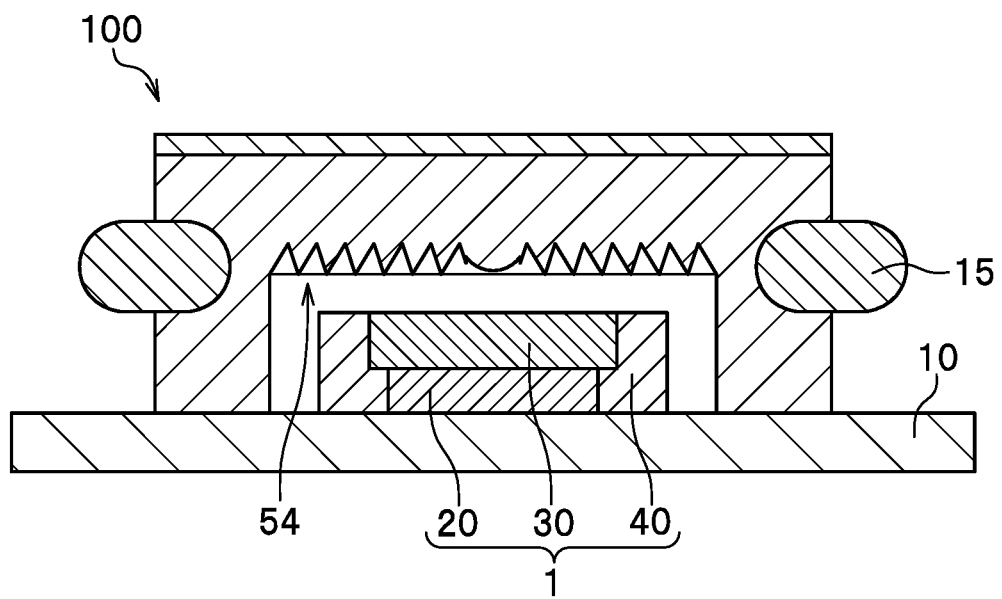
FIG. 3E is a cross-sectional view illustrating a step of disposing the cover in the method for manufacturing the light-emitting device according to the first embodiment.

FIG. 2 shows a flowchart of a method for manufacturing the light-emitting device according to the first embodiment. FIG. 3A is a cross-sectional view illustrating a step of fabricating a cover and a fixing member in the method for manufacturing the light-emitting device according to the first embodiment. FIG. 3B is a cross-sectional view illustrating a step of forming a hard-coat layer in the method for manufacturing the light-emitting device according to the first embodiment. FIG. 3C is a cross-sectional view illustrating a step of disposing a light-emitting element on a substrate in the method for manufacturing the light-emitting device according to the first embodiment. FIG. 3D is a cross-sectional view illustrating a step of forming a light-reflective member in the method for manufacturing the light-emitting device according to the first embodiment. FIG. 3E is a cross-sectional view illustrating a step of disposing the cover in the method for manufacturing the light-emitting device according to the first embodiment. Note that, as it is preferable to dispose a light-emitting element 20 with a light-reflective member 40 on a substrate 10, the step illustrated in FIG. 3C may be omitted to start the manufacturing of the light-emitting device 100 from the step illustrated in FIG. 3D.

A method for manufacturing the light-emitting device 100 includes: a cover and fixing member fabrication step S101 including sandwiching a fixing member 15 by a molding device 80 and injecting a light-transmissive material into a space defined in the molding device 80, hardening or curing the injected light-transmissive material to form a cover 50 including an upper portion 51 and a sidewall 52 extending along a peripheral edge of the upper portion 51, the cover 50 having a recess 54 defined by the upper portion 51 and the sidewall 52, the cover 50 being integrated with the fixing member 15 such that the fixing member 15 projects from a part of an outer lateral surface of the sidewall 52; a hard-coat layer forming step S102 including forming a hard-coat layer 60 on an upper surface of the cover 50; a light-transmissive member disposing step S103 including disposing a light-transmissive member 30 on a light extraction surface of a light-emitting element 20 to be disposed on a substrate 10; a light-emitting element mounting step S104 including mounting the light-emitting element 20 on the substrate 10 so that the light-transmissive member 30 is located on the upper side of the light-emitting element 20; a light-reflective member forming step S105 including forming a light-reflective member 40 that covers the lateral surface of the light-emitting element 20 and the lateral surface of the light-transmissive member 30; and a cover disposing step S106 including disposing the cover 50 so that the light-emitting element 20 is housed in the recess 54.

The fixing member 15, which is used in the cover and fixing member fabrication step S101, is made of a soft material that is deformable due to a pressing force generated in the event of an engagement with a counterpart member.

The materials and arrangement of the members are substantially the same as or similar to those of the above-described light-emitting device 100, and therefore descriptions thereof will be omitted as appropriate.

Cover and Fixing Member Fabrication Step

The cover and fixing member fabrication step S101 includes sandwiching a fixing member 15 with a molding device 80 and injecting a light-transmissive material into a space defined in the molding device 80, and hardening or curing the light-transmissive material. In the step S101, produced as a result of hardening or curing the light-transmissive material are a cover 50 and a fixing member 15 projecting from a part of an outer lateral surface of the cover 50. The cover 50 includes an upper portion 51 and a sidewall 52 extending along the peripheral edge of the upper portion 51. The upper portion 51 and the sidewall 52 together define a recess 54. The upper portion 51 defines a bottom of the recess 54, and the sidewall 52 defines a lateral side of the recess 54.

The step S101 provides an upper mold 81 and a lower mold 82, which constitute the molding device 80, and the fixing member 15, which is formed in a loop shape in advance. Subsequently, the fixing member 15 is sandwiched between the upper mold 81 and the lower mold 82, and then the light-transmissive material is injected into a space defined by the upper mold 81 and the lower mold 82 via a resin injection port 85. In this event, the light-transmissive material spreads over the surface of the fixing member 15 projecting from the part of the outer lateral surface of the sidewall 52. As a result, the fixing member 15 is covered by a thin film 55 (see FIG. 1E). Subsequently, the light-transmissive material injected into the space is hardened or cured, and then the molding device 80 is detached. In this way, the cover 50 provided with the fixing member 15 projecting from the part of the outer lateral surface of the sidewall 52 is produced. Here, "hardening" means, in a case in which a thermoplastic resin is to be used as the light-transmissive material, cooling the thermoplastic resin having been heated and melted to solidify the thermoplastic resin. Here, "curing" means, in a case in which a thermosetting resin is to be used as the light-transmissive material, heating the thermosetting resin in a liquid state to solidify the thermosetting resin.

In the step S101, the molding device 80 may include a left mold and a right mold in addition to the upper mold and the lower mold.

Hard-Coat Layer Forming Step

The hard-coat layer forming step S102 includes forming a hard-coat layer 60 on an upper surface of the cover 50.

In the step S102, the hard-coat layer 60 is formed continuously on the upper surface of the upper portion 51 of the cover 50 and the upper surface of the sidewall 52 of the cover 50 by a spray method or by affixing a resin sheet or the like, for example.

Light-Transmissive Member Disposing Step

The light-transmissive member disposing step S103 includes disposing a light-transmissive member 30 on a light extraction surface of a light-emitting element 20 to be disposed on a substrate 10.

In the step S103, for example, the light-transmissive member 30 having a predetermined shape is bonded to the light extraction surface of the light-emitting element 20. In the event of bonding the light-transmissive member 30 to the light-emitting element 20, the light-transmissive member 30 may be directly bonded to the light-emitting element 20 or may be bonded via bonding member with light-transmissive properties. Alternatively, the light-transmissive member 30 may be formed by a spray method.

Light-Emitting Element Mounting Step

The light-emitting element mounting step S104 includes mounting the light-emitting element 20 on the substrate 10 so that the light-transmissive member 30 is located on the upper side of the light-emitting element 20.

The light-emitting element 20 has an electrode formation surface as a mounting surface and is flip-chip mounted on wiring formed on the substrate 10 via a conductive bonding member. Examples of the conductive bonding member include a eutectic solder, a conductive paste, and bumps.

Note that the light-transmissive member disposing step S103 and the light-emitting element mounting step S104 may not necessarily be clearly distinguished. For example, the light-emitting element 20 may be disposed on the substrate 10 and then bonded to the light-transmissive member 30.

Light-Reflective Member Forming Step

The light-reflective member forming step S105 includes forming a light-reflective member 40 that covers the lateral surface of the light-emitting element 20 and the lateral surface of the light-transmissive member 30.

In the step S105, for example, the light-reflective member 40 is formed by supplying resin or the like to constitute the light-reflective member 40 on the substrate 10 by using a discharge device (dispenser) that is moveable in the up-down direction, in the horizontal direction or the like relative to the substrate 10. Alternatively, the light-reflective member 40 may be formed by compression molding, transfer molding, or the like.

The light-reflective member 40 is preferably formed before the light-emitting element 20 is disposed on the substrate 10. More specifically, it is preferable to dispose the light-transmissive member 30 on the upper surface of the light-emitting element 20, then dispose the light-reflective member 40 on the lateral surface of the light-emitting element 20 and on the lateral surface of the light-transmissive member 30, and then dispose the light-emitting element 20, on which the light-transmissive member 30 and the light-reflective member 40 has been disposed, on the substrate 10. This makes it easy to form the light-emitting element 20 provided with the light-reflective member 40 and reduces the heat transferred to the substrate 10 and reduces the pressure applied to the substrate 10.

Cover Disposing Step

The cover disposing step S106 includes disposing the cover 50 so that the light-emitting element 20 is housed in the recess 54.

In the step S106, a lower surface of the sidewall 52 of the cover 50 is fixed to the upper surface of the substrate 10 with an adhesive member therebetween. As a result, the light-emitting element 20 is housed in the recess 54 of the cover 50.

Illumination Device

Figure 4:
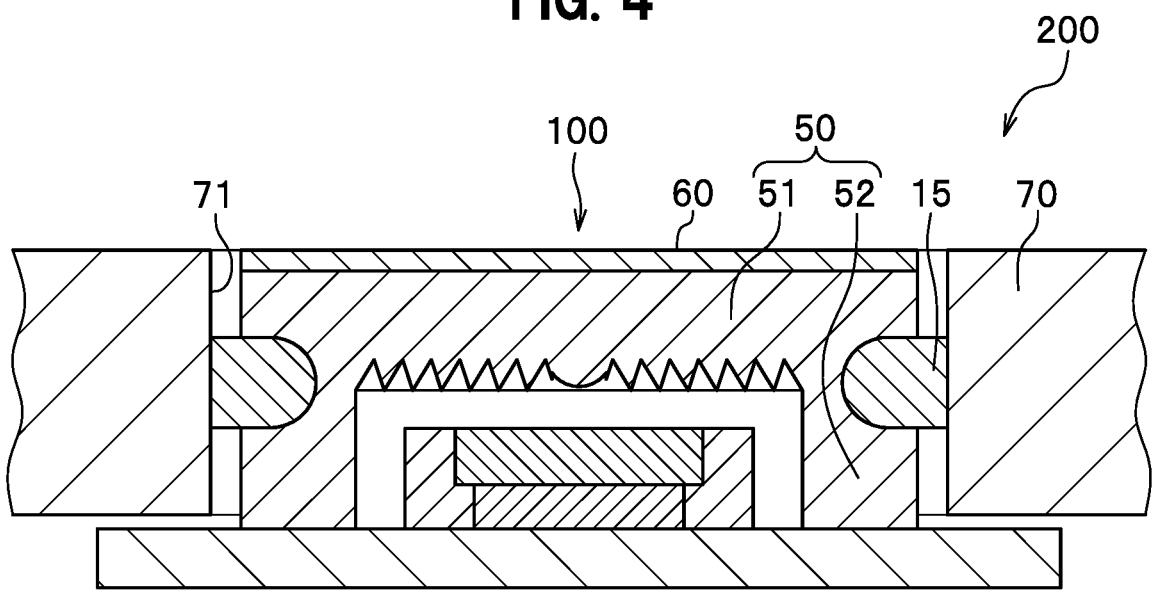
FIG. 4 is a cross-sectional view schematically illustrating the configuration of an illumination device according to the first embodiment.

FIG. 4 is a cross-sectional view schematically illustrating the configuration of an illumination device according to the first embodiment.

The illumination device 200 according to the first embodiment includes the above-described light-emitting device 100 and a counterpart member constituted by a casing 70 having a through-hole 71. The light-emitting device 100 is fixed to the casing 70 of the illumination device 200 by the fixing member 15 of the light-emitting device 100 being in contact with the inner surface of the through-hole 71 of the casing 70 in a state of being deformed.

The light-emitting device 100 is structured as described above.

Casing

The casing 70 has the through-hole 71. The casing 70 is a member to which the light-emitting device 100 is to be fixed. The casing 70 may be a part of the casing of a mobile phone that employs the light-emitting device 100 as a flashlight light source.

The size of the through-hole 71 is larger than the size of the cover 50 in plan view such that the upper surface of the cover 50, which is the upper surface of the hard-coat layer 60, is exposed. The size of the through-hole 71 is smaller than the size of the light-emitting device 100 including the size of the fixing member 15 in plan view. With this structure, in the illumination device 200, the fixing member 15 is in contact with the inner surface of the through-hole 71 of the casing 70 and is deformed by being pressed due to the pressure from the inner surface, and whereby the light-emitting device 100 is fixed to the casing 70. The casing 70 is preferably formed of a light-blocking material. To restrict the light distributing angle by which the light emitted from the light-emitting device 100 is to be distributed, the casing is preferably formed of a light-reflective resin in which a filler is contained to reflect light, a light-absorbing resin that absorbs light, or the like. Preferably, the through-hole 71 has the shape of a circle, oval, triangle, quadrilateral, hexagon or the like in plan view.

Method for Manufacturing Illumination Device

Next, a description will be given of an example of a method for manufacturing the illumination device 200.

Figure 5:
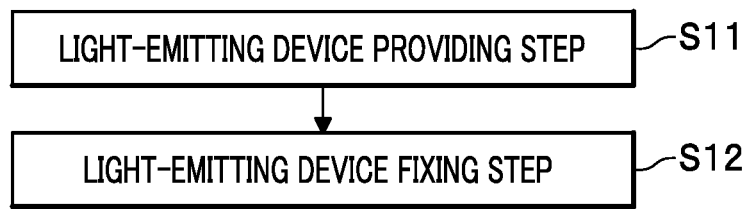
FIG. 5 shows a flowchart of a method for manufacturing the illumination device according to the first embodiment.

FIG. 5 shows a flowchart of a method for manufacturing the illumination device according to the first embodiment.

The method for manufacturing the illumination device 200 includes: a light-emitting device providing step S11 including providing a light-emitting device 100 using the method for manufacturing the light-emitting device 100; and a light-emitting device fixing step S12 including fixing the light-emitting device 100 in the counterpart member, which is constituted by the casing 70 having the through-hole 71, so that the fixing member 15 of the light-emitting device 100 comes in contact with the inner surface of the through-hole 71 of the casing 70 in a state of being deformed.

The materials and arrangement of the members are substantially the same as or similar to those of the above-described illumination device 200, and therefore descriptions thereof will be omitted as appropriate.

Light-Emitting Device Providing Step

The light-emitting device providing step S11 includes providing the light-emitting device 100 using the above-described method for manufacturing the light-emitting device 100.

In the step S11, the light-emitting device 100 is manufactured by carrying out steps S101 to S106 described above.

Light-Emitting Device Fixing Step

The light-emitting device fixing step S12 includes fixing the light-emitting device 100 in a counterpart member, constituted by the casing 70 having the through-hole 71, so that the fixing member 15 of the light-emitting device 100 comes in contact with the inner surface of the through-hole 71 of the casing 70 in a state of being deformed.

In the step S12, the light-emitting device 100 is engaged with casing 70 by inserting the light-emitting device 100 into the through-hole 71 of the casing 70 in such a manner that the upper portion 51 of the cover 50 is inserted earlier and that the fixing member 15 is brought into contact with the inner surface of the through-hole 71 of the casing 70. In this event, as the fixing member 15 is formed of a soft material that is deformable due to a pressing force generated in the event of the engagement with the casing 70, the fixing member 15 gets deformed when being brought into contact with the inner surface of the through-hole 71 of the casing 70, and as a result, the light-emitting device 100 is fixed in the casing 70.

Incidentally, for example, the casing 70 may be constituted by an upper member having the through-hole 71 and a lower member. In this case, the light-emitting device 100 is first inserted into the through-hole 71 from the lower side of the upper member, and then, the upper member and the lower member are joined.

Second Embodiment

Light-Emitting Device

Figure 6A:
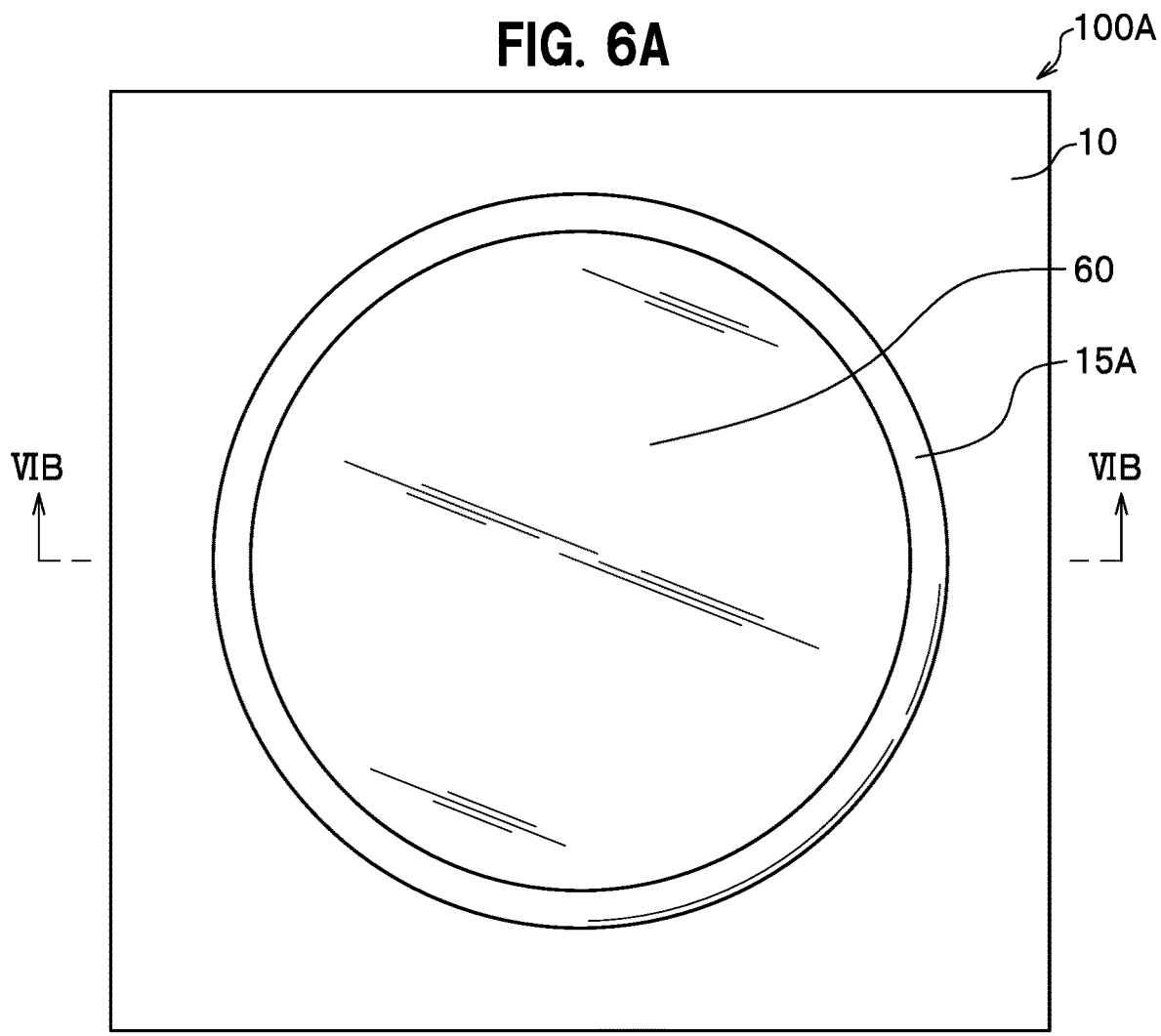
FIG. 6A is a plan view schematically illustrating the configuration of a light-emitting device according to a second embodiment.
Figure 6B:
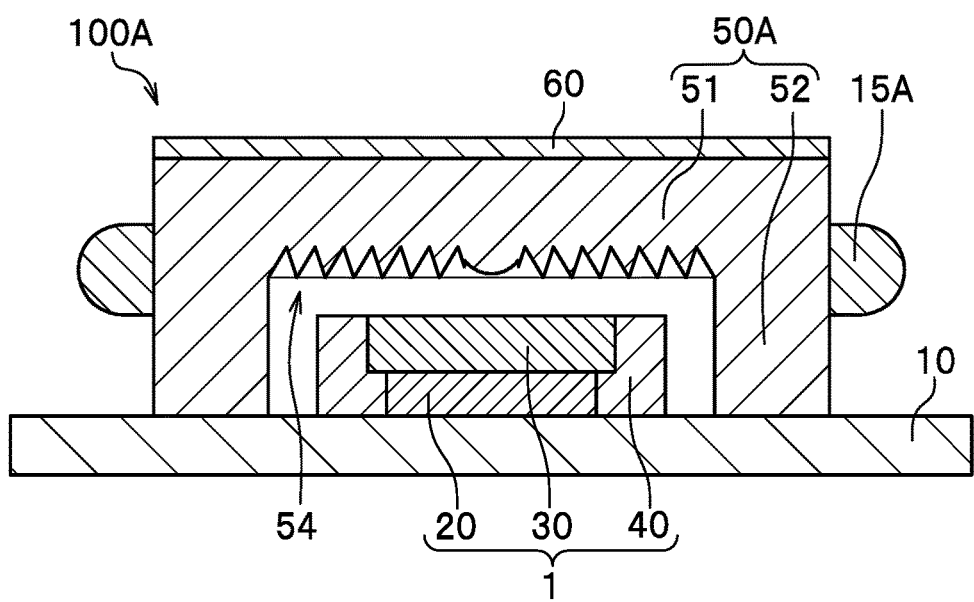
FIG. 6B is a cross-sectional view taken along line VIB-VIB in FIG. 6A.

FIG. 6A is a plan view schematically illustrating the configuration of a light-emitting device according to a second embodiment. FIG. 6B is a cross-sectional view taken along line VIB-VIB in FIG. 6A.

A light-emitting device 100A according to the second embodiment is provided with a fixing member 15A projecting from a part of the outer lateral surface of the sidewall 52 of a cover 50A without being partially inserted in the sidewall 52. In addition, the fixing member 15A is not covered by a thin film formed of the material of the sidewall 52 of the cover 50A.

As the same as or similar to the fixing member 15, the fixing member 15A is formed of a soft material that is deformable due to a pressing force generated in the event of an engagement with a counterpart member.

The features of the light-emitting device 100A other than those described above are substantially the same as or similar to those of the above-described light-emitting device 100 according to the first embodiment.

Method for Manufacturing Light-Emitting Device

Next, a description will be given of an example of a method for manufacturing the light-emitting device 100A.

Figure 7:
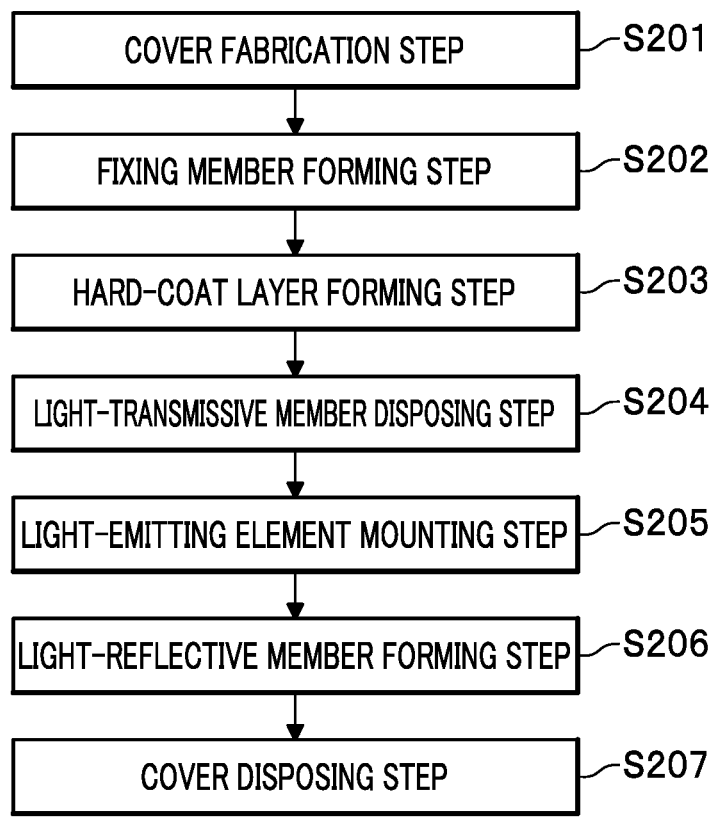
FIG. 7 shows a flowchart of a method for manufacturing the light-emitting device according to the second embodiment.
Figure 8A:
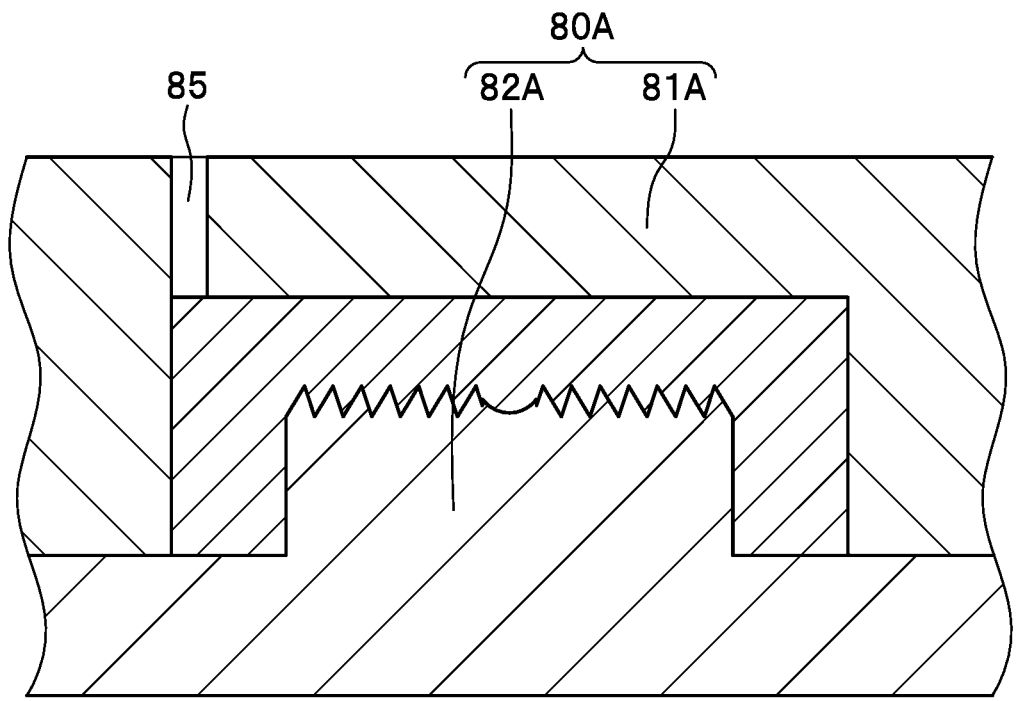
FIG. 8A is a cross-sectional view illustrating a step of fabricating a cover in the method for manufacturing the light-emitting device according to the second embodiment.
Figure 8B:
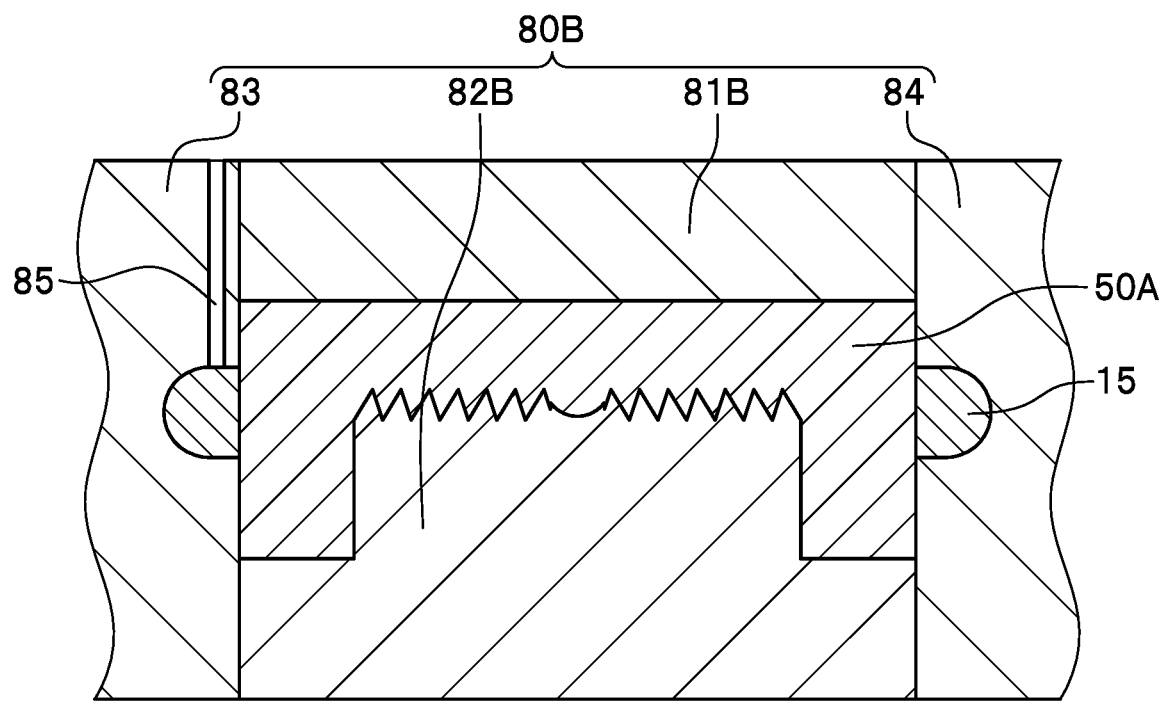
FIG. 8B is a cross-sectional view illustrating a step of forming a fixing member in the method for manufacturing the light-emitting device according to the second embodiment.

FIG. 7 shows a flowchart of a method for manufacturing the light-emitting device according to the second embodiment. FIG. 8A is a cross-sectional view illustrating a step of fabricating a cover in the method for manufacturing the light-emitting device according to the second embodiment. FIG. 8B is a cross-sectional view illustrating a step of forming a fixing member in the method for manufacturing the light-emitting device according to the second embodiment.

The method for manufacturing the light-emitting device 100A includes: a cover fabrication step S201 including injecting a light-transmissive material into a space defined by a molding device 80A and hardening or curing the injected light-transmissive material to form a cover 50A including an upper portion 51 and a sidewall 52 extending along a peripheral edge of the upper portion 51, the cover 50A having a recess 54 defined by the upper portion 51 and the sidewall 52; a fixing member forming step S202 including forming a fixing member 15A projecting from a part of an outer lateral surface of the sidewall 52; a hard-coat layer forming step S203 including forming a hard-coat layer 60 on an upper surface of the cover 50A; a light-transmissive member disposing step S204 including disposing a light-transmissive member 30 on a light extraction surface of a light-emitting element 20 to be disposed on a substrate 10; a light-emitting element mounting step S205 including mounting the light-emitting element 20 on the substrate 10 so that the light-transmissive member 30 is located on the upper side of the light-emitting element 20; a light-reflective member forming step S206 including forming a light-reflective member 40 that covers the lateral surface of the light-emitting element 20 and the lateral surface of the light-transmissive member 30; and a cover disposing step S207 including disposing the cover 50A so that the light-emitting element 20 is housed in the recess 54.

The fixing member 15A, which is formed in the fixing member forming step S202, is formed of a soft material that is deformable due to a pressing force generated in the event of an engagement with a counterpart member.

The materials and arrangement of the members are substantially the same as or similar to described above regarding the structure of the light-emitting device 100A, and therefore descriptions thereof will be omitted as appropriate.

In addition, steps S203 to S207 are substantially the same as or similar to the above-described steps S102 to S106, respectively, and therefore descriptions thereof will be omitted as appropriate.

Cover Fabrication Step

The cover fabrication step S201 includes injecting a light-transmissive material into a space defined by a molding device 80A and hardening or curing the injected light-transmissive material. In the step S201, produced as a result of hardening or curing the light-transmissive material is a cover 50A that includes an upper portion 51 and a sidewall 52 extending along the peripheral edge of the upper portion 51 and has a recess 54 whose bottom is defined by the upper portion 51 and whose side is defined by the sidewall 52.

In the step S201, an upper mold 81A and a lower mold 82A, which constitute the molding device 80A, are provided. Subsequently, light-transmissive material is injected into a space defined by the upper mold 81a and the lower mold 82A via a resin injection port 85. Subsequently, the light-transmissive material injected into the space is hardened or cured and then the molding device 80A is detached. In this way, the cover 50A is produced.

Fixing Member Forming Step

The fixing member forming step S202 include forming a fixing member 15A on an outer lateral surface of the sidewall 52 such that the fixing member 15A projects from a part of the outer lateral surface of the sidewall 52.

In the step S202, for example, the cover 50A is placed in a molding device 80B, and then the fixing member 15A is formed on the outer lateral surface of the sidewall 52 by injection molding, transfer molding, or compression molding.

In the step S202, for example, an upper mold 81B, a lower mold 82B, a left mold 83, and a right mold 84, which constitute the molding device 80B, are provided. Subsequently, the raw material of the fixing member 15A is injected into a space defined by the molding device 80B via a resin injection port 85. Subsequently, the raw material injected into the space is hardened or cured and then the molding device 80B is detached. In this way, the fixing member 15A is formed on the outer lateral surface of the sidewall 52 of the cover 50A.

Illumination Device

Figure 9:
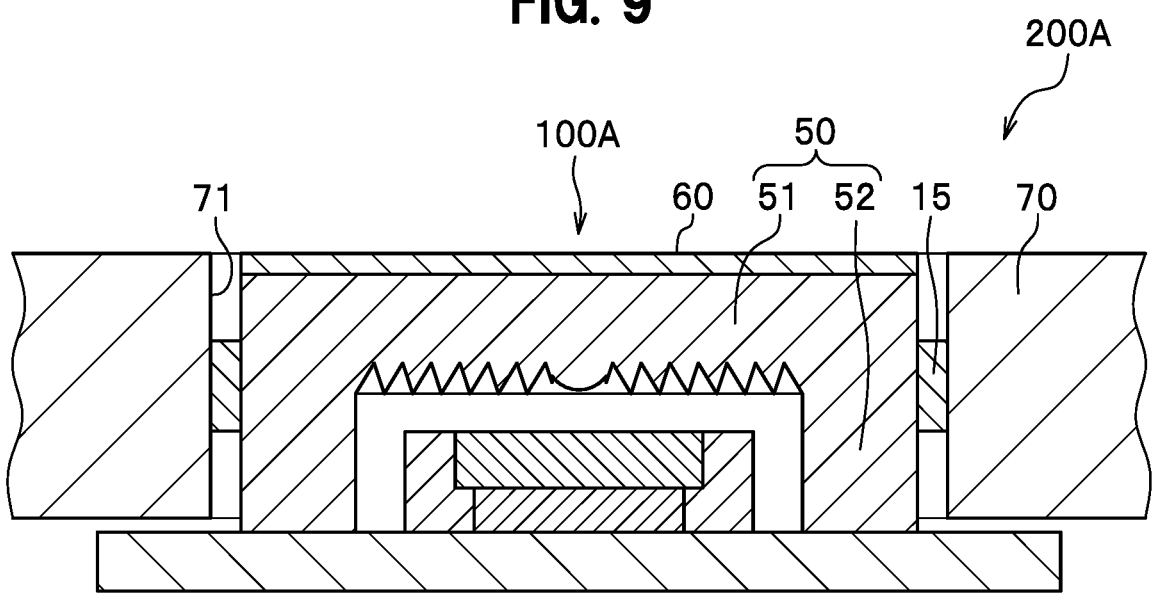
FIG. 9 is a cross-sectional view schematically illustrating the configuration of an illumination device according to the second embodiment.

FIG. 9 is a cross-sectional view schematically illustrating the configuration of an illumination device according to the second embodiment.

An illumination device 200A according to the second embodiment includes the above-described light-emitting device 100A and a counterpart member constituted by a casing 70 having a through-hole 71. The light-emitting device 100A is fixed to the casing 70 of the illumination device 200A by the fixing member 15A of the light-emitting device 100A being in contact with the inner surface of the through-hole 71 of the casing 70 in a state of being deformed.

The illumination device 200A is substantially the same as or similar to the illumination device 200 according to the first embodiment except that the above-described light-emitting device 100A is used in place of the light-emitting device 100.

Method for Manufacturing Illumination Device

Next, a description will be given of an example of a method for manufacturing the illumination device 200A.

The method for manufacturing the illumination device 200A is substantially the same as or similar to the method for manufacturing the illumination device 200 according to the first embodiment except that the light-emitting device 100A provided by the above-described method for manufacturing the light-emitting device 100A is used in place of the light-emitting device 100.

Third Embodiment

Light-Emitting Device

Figure 10A:
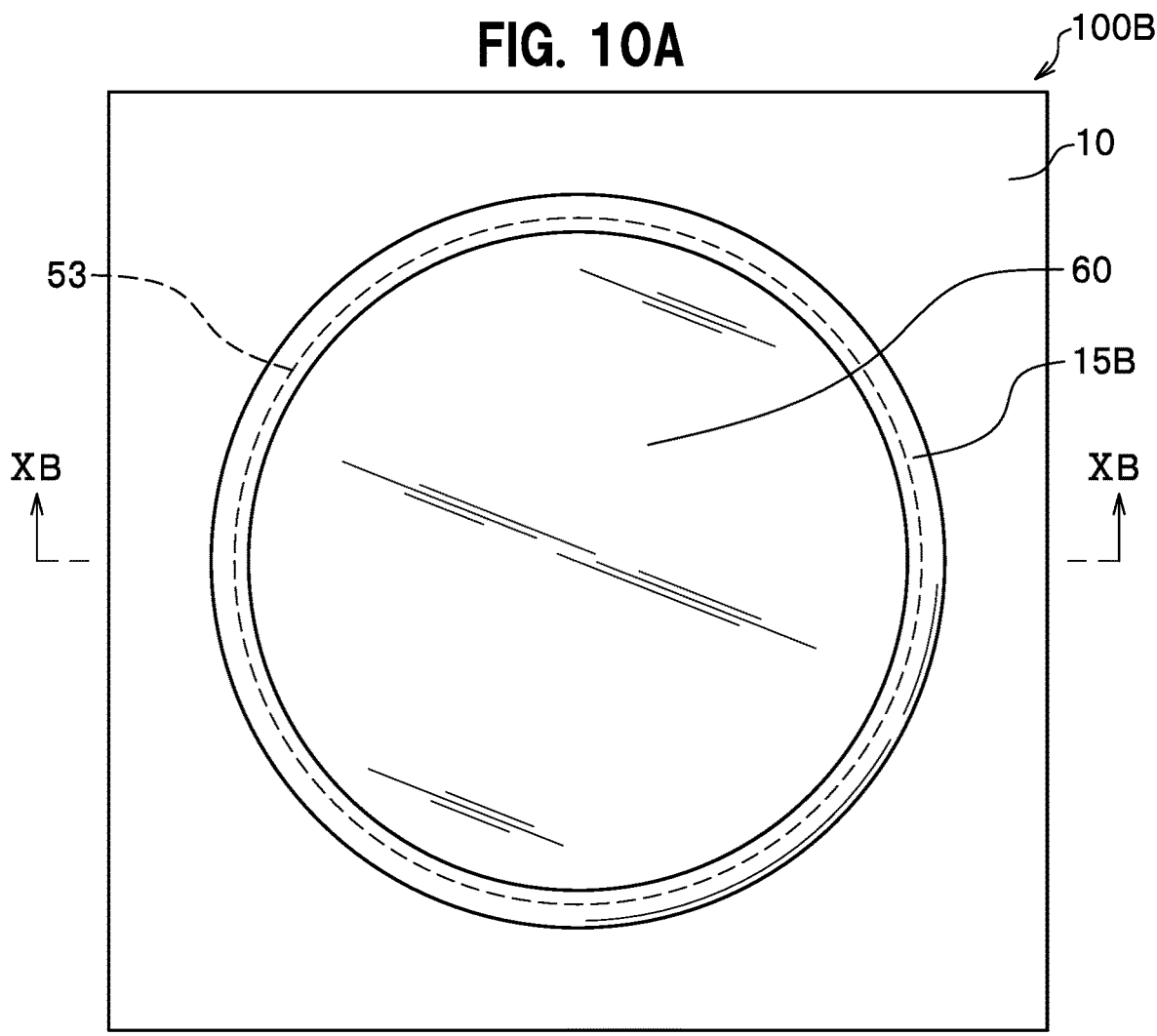
FIG. 10A is a plan view schematically illustrating the configuration of a light-emitting device according to a third embodiment.
Figure 10B:
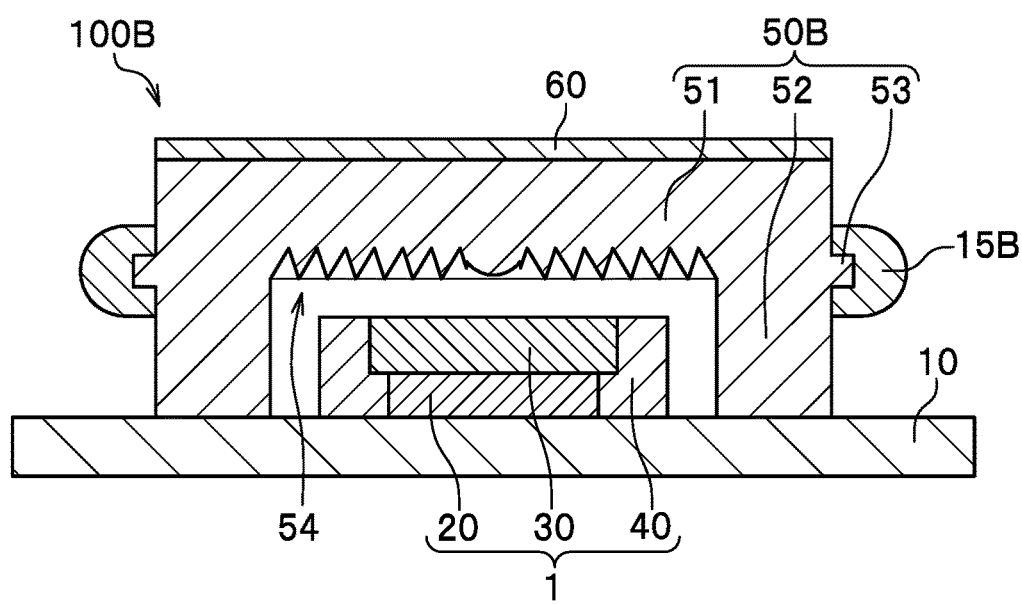
FIG. 10B is a cross-sectional view taken along line XB-XB in FIG. 10A.

FIG. 10A is a plan view schematically illustrating the configuration of a light-emitting device according to the third embodiment. FIG. 10B is a cross-sectional view taken along line XB-XB in FIG. 10A.

A light-emitting device 100B according to the third embodiment has a cover 50B with a sidewall 52 having an outer lateral surface on a part of which a projected portion 53 is formed. The fixing member 15B covers the projected portion 53. The projected portion 53 can be encapsulated by the fixing member 15B so as to be positioned inside thereof. With this configuration, the fixing member 15B can easily be firmly fixed to the outer lateral surface of the sidewall 52.

The projected portion 53 is formed monolithically with the sidewall 52 by molding them together from the same material.

The fixing member 15B is, like the fixing member 15A, formed of a soft material that is deformable due to a pressing force generated in the event of an engagement with a counterpart member.

Preferably, the projected portion 53 is formed on the entirety of the part of the sidewall 52 where the fixing member 15B is to be provided. For example, in a case in which the fixing member 15B is to be formed continuously on the outer lateral surface of the sidewall 52 in a loop shape in plan view, the projected portion 53 is preferably formed continuously on the outer lateral surface of the sidewall 52 in a loop shape in plan view. With this configuration, the fixing member 15B can easily be more firmly fixed to the outer lateral surface of the sidewall 52. In addition, the projected portion 53 is easily formed on the outer lateral surface of the sidewall 52 in the process of manufacturing the light-emitting device 100B.

The projected portion 53 has a quadrilateral cross section. With this structure, the fixing member 15B can easily be firmly fixed to the outer lateral surface of the sidewall 52. The cross-sectional shape of the projected portion 53 can be any shape so long as the fixing member 15B is fixed to the outer lateral surface of the sidewall 52. For example, the cross-sectional shape of the projected portion 53 may be a triangle, a half circle, a half oval, or a shape with an arc-shaped distal end.

The features of the light-emitting device 100B other than those described above are substantially the same as or similar to those of the above-described light-emitting device 100A according to the second embodiment.

Method for Manufacturing Light-Emitting Device

Next, a description will be given of an example of a method for manufacturing the light-emitting device 100B.

Figure 11A:
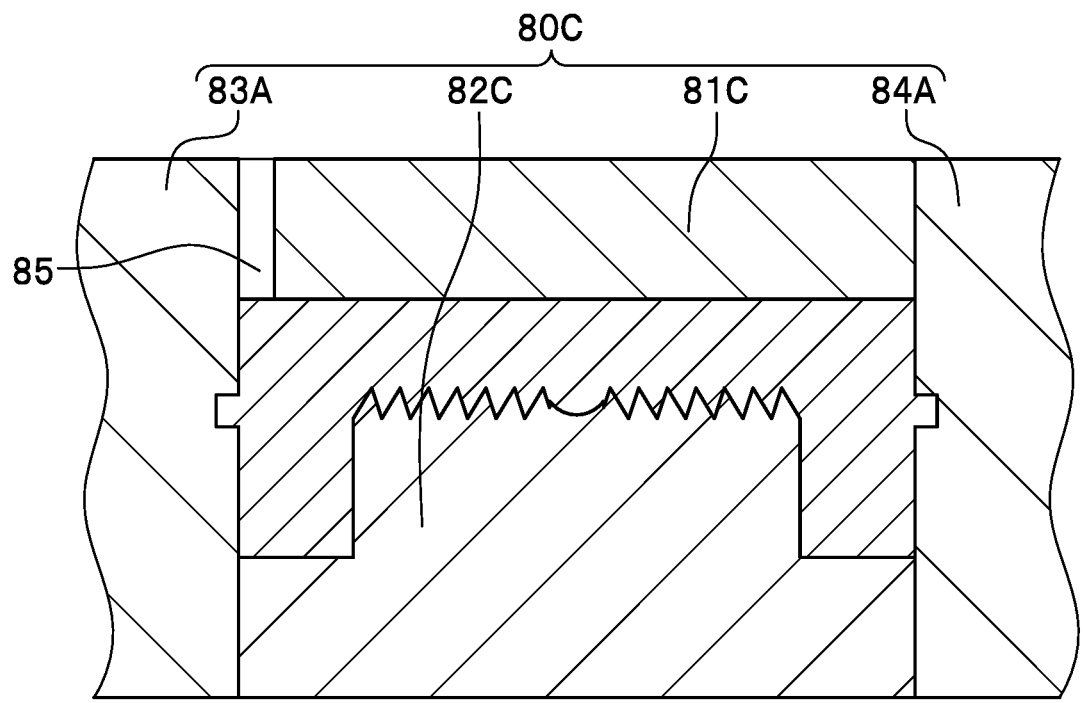
FIG. 11A is a cross-sectional view illustrating a step of fabricating a cover in the method for manufacturing the light-emitting device according to the third embodiment.
Figure 11B:
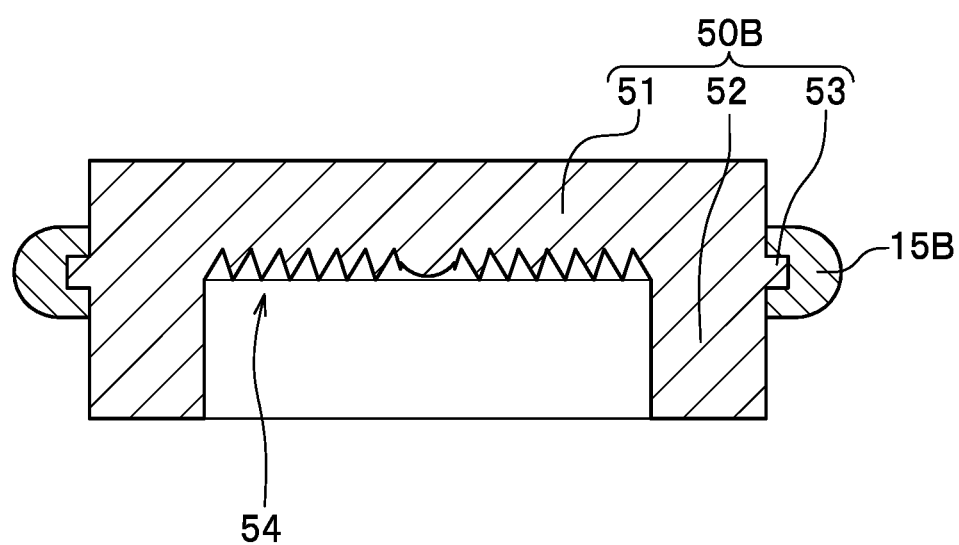
FIG. 11B is a cross-sectional view illustrating a step of disposing a fixing member in the method for manufacturing the light-emitting device according to the third embodiment.

FIG. 11A is a cross-sectional view illustrating a step of fabricating a cover in the method for manufacturing the light-emitting device according to the third embodiment. FIG. 11B is a cross-sectional view illustrating a step of disposing a fixing member in the method for manufacturing the light-emitting device according to the third embodiment.

In the method for manufacturing the light-emitting device 100B, the projected portion 53 is formed on a part of the outer lateral surface of the sidewall 52 in the cover fabrication step S201 of the above-described method for manufacturing light-emitting device 100A. In the method for manufacturing the light-emitting device 100B, the fixing member 15B is formed so that the fixing member 15B covers the projected portion 53, in the fixing member forming step S202 of the above-described method for manufacturing light-emitting device 100A. The projected portion 53 can be encapsulated by the fixing member 15B so as to be positioned inside thereof. Except these matters, the method for manufacturing the light-emitting device 100B is substantially the same as or similar to the method for manufacturing the light-emitting device 100A according to the second embodiment. Hereinbelow, a description will be given of the cover fabrication step of the method for manufacturing the light-emitting device 100B and of the fixing member forming step of the method for manufacturing the light-emitting device 100B.

The cover fabrication step of the method for manufacturing the light-emitting device 100B includes injecting a light-transmissive material into a space defined by a molding device 80C and hardening or curing the injected light-transmissive material. In this step, produced as a result of hardening or curing the light-transmissive material is a cover 50B that includes an upper portion 51 and a sidewall 52 extending along the peripheral edge of the upper portion 51. The cover 50B has a recess 54 whose bottom is defined by the upper portion 51 and whose side is defined by the sidewall 52. The cover 50B has a projected portion 53 on a part of an outer lateral surface of the sidewall 52.

In this step, an upper mold 81C, a lower mold 82C, a left mold 83A, and a right mold 84A, which constitute the molding device 80C, are provided. Subsequently, the light-transmissive material is injected into the space defined by the molding device 80C via a resin injection port 85. Subsequently, the light-transmissive material injected into the space is hardened or cured and then the molding device 80C is detached. In this way, the cover 50B is produced.

In the fixing member forming step of the method for manufacturing the light-emitting device 100B, a fixing member 15B is formed so as to project from the part of the outer lateral surface of the sidewall 52.

In this step, for example, the fixing member 15B, which has been provided in advance, is disposed on the outer lateral surface of the sidewall 52 in such a way that the projected portion 53 is inserted into the fixing member 15B. As the fixing member 15B is formed of a soft material, it is easily fitted over the projected portion 53.

Alternatively, in this step, like the above-described method for manufacturing the light-emitting device 100A, the fixing member 15B can be formed in such a way that the cover 50B is placed in a molding device and then the fixing member 15B is formed on the outer lateral surface of the sidewall 52 by injection molding, transfer molding, or compression molding (see FIG. 8B).

Illumination Device

Figure 12:
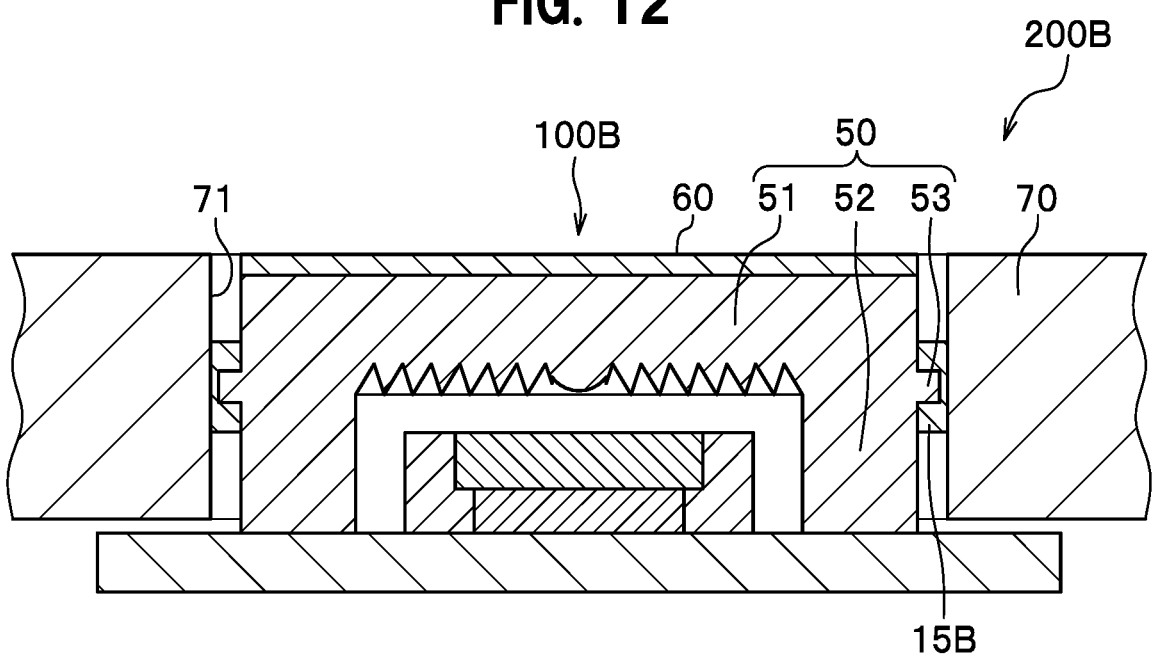
FIG. 12 is a cross-sectional view schematically illustrating the configuration of an illumination device according to the third embodiment.

FIG. 12 is a cross-sectional view schematically illustrating the configuration of an illumination device according to the third embodiment.

An illumination device 200B according to the third embodiment includes the above-described light-emitting device 100B and a counterpart member constituted by a casing 70 having a through-hole 71. The light-emitting device 100B is fixed to the casing 70 of the illumination device 200B by the fixing member 15B of the light-emitting device 100B being in contact with the inner surface of the through-hole 71 of the casing 70 in a state of being deformed.

The illumination device 200B is substantially the same as or similar to the illumination device 200 according to the first embodiment except that the above-described light-emitting device 100B is used in place of the light-emitting device 100.

Method for Manufacturing Illumination Device

Next, a description will be given of an example of a method for manufacturing the illumination device 200B.

The method for manufacturing the illumination device 200B is substantially the same as or similar to the method for manufacturing the illumination device 200 according to the first embodiment except that the light-emitting device 100B provided by the above-described method for manufacturing the light-emitting device 100B is used in place of the light-emitting device 100.

Fourth Embodiment

Light-Emitting Device

Figure 13A:
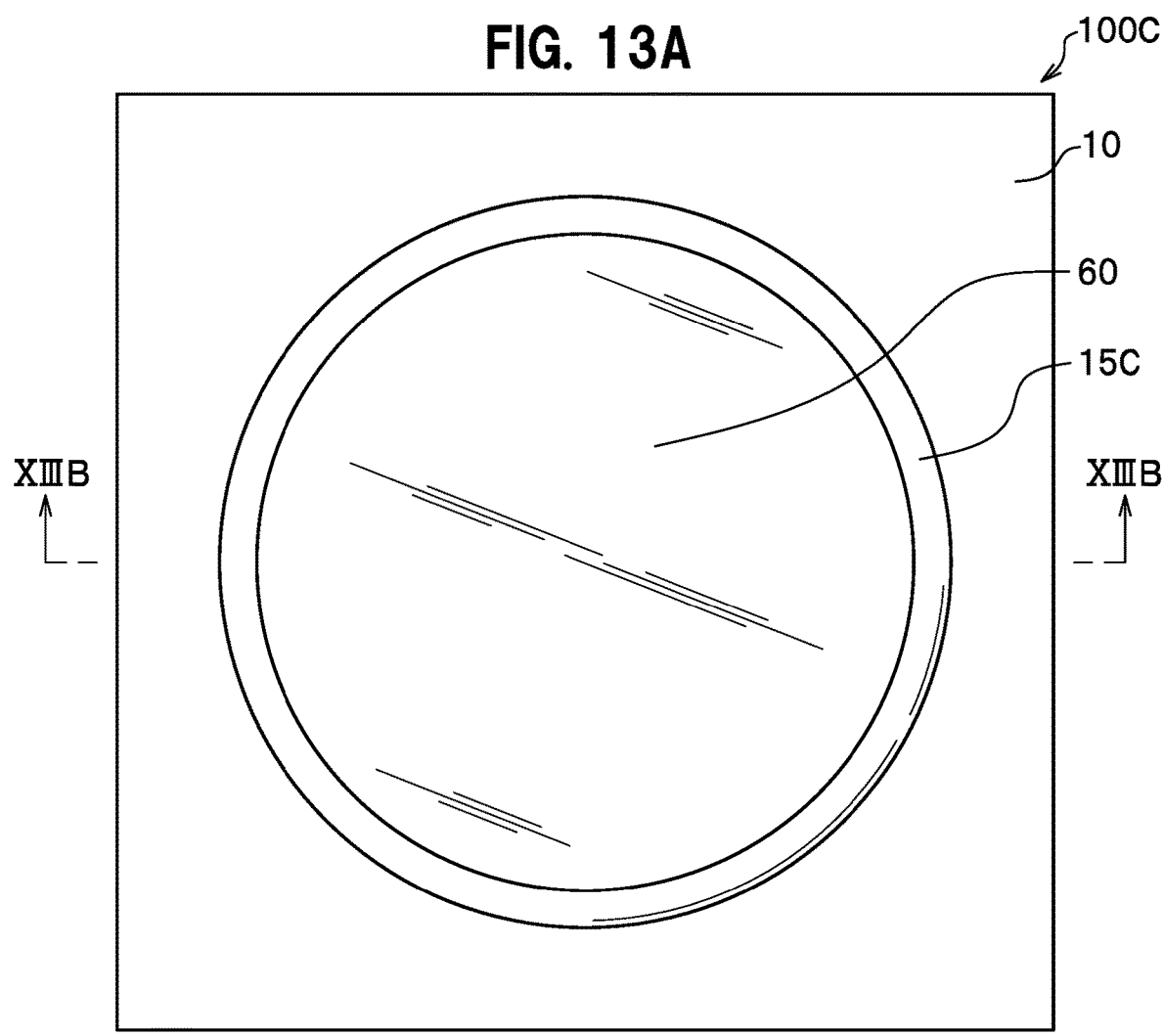
FIG. 13A is a plan view schematically illustrating the configuration of a light-emitting device according to a fourth embodiment.
Figure 13B:
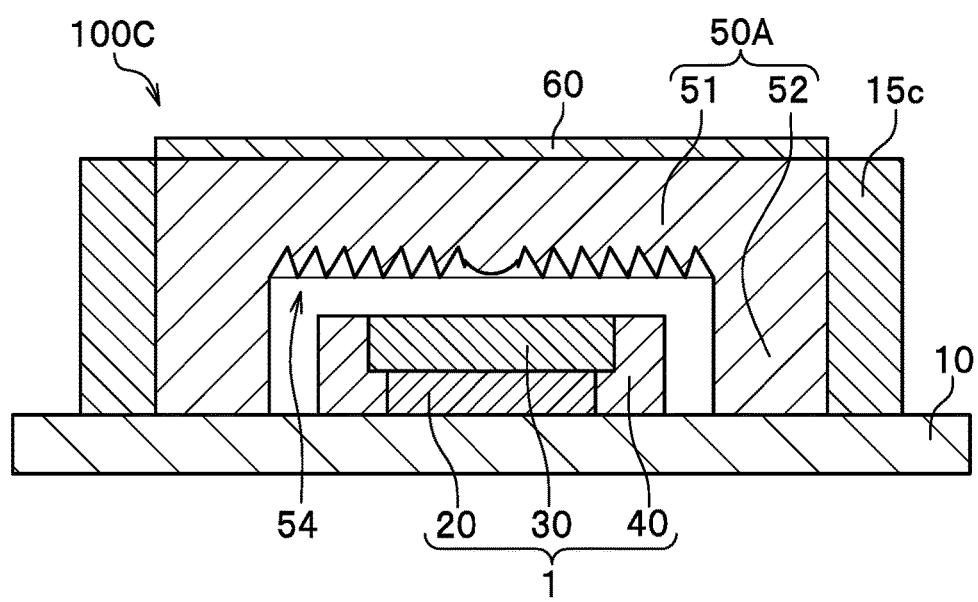
FIG. 13B is a cross-sectional view taken along line XIIIB-XIIIB in FIG. 13A.

FIG. 13A is a plan view schematically illustrating the configuration of a light-emitting device according to the fourth embodiment. FIG. 13B is a cross-sectional view taken along line XIIIB-XIIIB in FIG. 13A.

A light-emitting device 100C according to the fourth embodiment has the cover 50A and a fixing member 15C that covers the outer lateral surface of the sidewall 52 of the cover 50A. The fixing member 15C is provided on the entirety of the outer lateral surface of the sidewall 52 of the cover 50A. With this configuration, the light-emitting device 100C is easily engaged with the casing 70 in a stable manner. In addition, the fixing member 15C is easily formed on the outer lateral surface of the sidewall 52 in the process of manufacturing the light-emitting device 100C.

Like the fixing member 15, the fixing member 15C is formed of a soft material that is deformable due to a pressing force generated in the event of the engagement with a counterpart member.

The features of the light-emitting device 100C other than those describe above are substantially the same as or similar those of the above-described light-emitting device 100 according to the first embodiment.

Method for Manufacturing Light-Emitting Device

Next, a description will be given of an example of a method for manufacturing the light-emitting device 100C.

Figure 14:
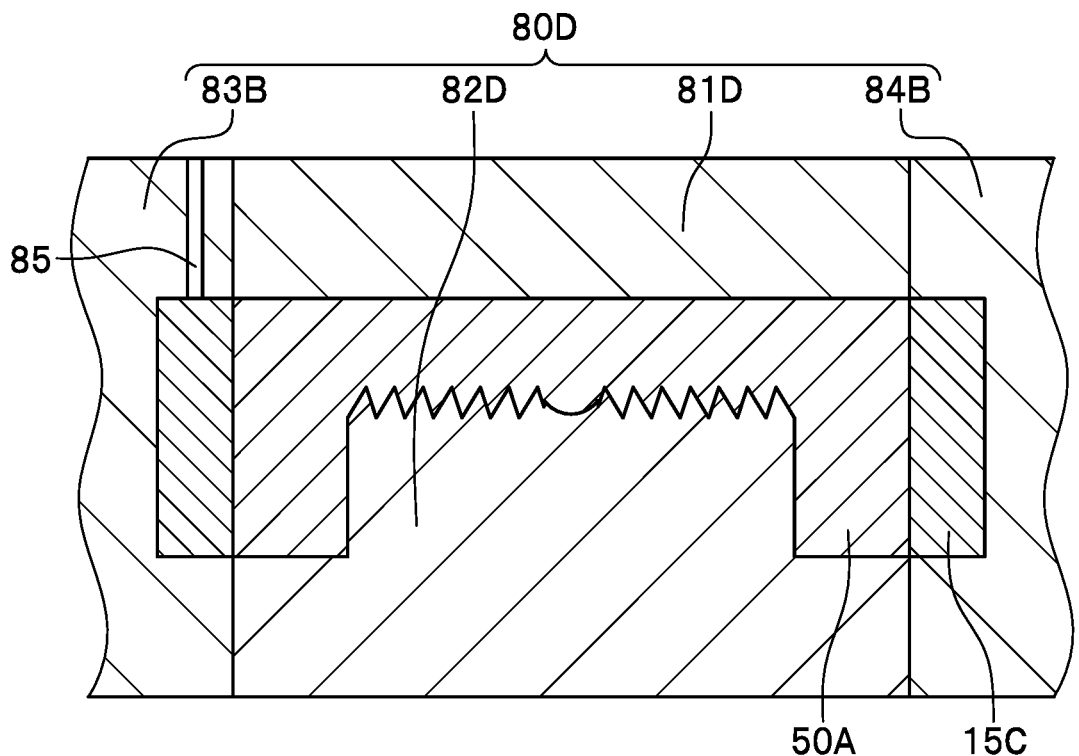
FIG. 14 is a cross-sectional view illustrating a step of forming a fixing member in the method for manufacturing the light-emitting device according to the fourth embodiment.

FIG. 14 is a cross-sectional view illustrating a step of forming a fixing member in the method for manufacturing the light-emitting device according to the fourth embodiment.

The method for manufacturing the light-emitting device 100C includes: a cover fabrication step including injecting a light-transmissive material into a space defined by a molding device 80D and hardening or curing the injected light-transmissive material to form a cover 50A including an upper portion 51, a sidewall 52 extending along a peripheral edge of the upper portion 51, and a recess 54 defined by the upper portion 51 and the sidewall 52; a fixing member forming step including forming a fixing member 15C on an outer lateral surface of the sidewall 52 so as to cover the outer lateral surface; a hard-coat layer forming step including forming a hard-coat layer 60 on an upper surface of the cover 50A; a light-transmissive member disposing step including disposing a light-transmissive member 30 on a light extraction surface of a light-emitting element 20 to be disposed on a substrate 10; a light-emitting element mounting step including mounting the light-emitting element 20 on the substrate 10 so that the light-transmissive member 30 is located on the upper side of the light-emitting element 20; a light-reflective member forming step including forming a light-reflective member 40 that covers the lateral surface of the light-emitting element 20 and the lateral surface of the light-transmissive member 30; and a cover disposing step including disposing the cover 50A so that the light-emitting element 20 is housed in the recess 54.

The fixing member 15C, which is used in the fixing member forming step, is formed of a soft material that is deformable due to a pressing force generated in the event of an engagement with a counterpart member.

In the method for manufacturing the light-emitting device 100C, in the fixing member forming step S202 of the above-described method for manufacturing the light-emitting device 100A, the fixing member 15C is formed on the outer lateral surface of the sidewall 52 of the cover 50A such that the fixing member 15C covers the outer lateral surface. Except this, the method for manufacturing the light-emitting device 100C is substantially the same as or similar to that for the light-emitting device 100A according to the second embodiment. Hereinbelow, a description will be given of the fixing member forming step of the method for manufacturing the light-emitting device 100C.

In the fixing member forming step of the method for manufacturing the light-emitting device 100C, the fixing member 15C is formed on the outer lateral surface of the sidewall 52 of the cover 50A such that the fixing member 15C covers the outer lateral surface.

In this step, for example, the cover 50A is placed in the molding device 80D, and then the fixing member 15C is formed on the entirety of the outer lateral surface of the sidewall 52 by injection molding, transfer molding, or compression molding.

In this step, for example, an upper mold 81D, a lower mold 82D, a left mold 83B, and a right mold 84B, which constitute the molding device 80D, are provided. Subsequently, the raw material of the fixing member 15C is injected into a space defined by molding device 80D via a resin injection port 85. Subsequently, the raw material injected into the space is hardened or cured and then the molding device 80D is detached. In this way, the fixing member 15C is formed on the outer lateral surface of the sidewall 52 of the cover 50A.

Illumination Device

Figure 15:
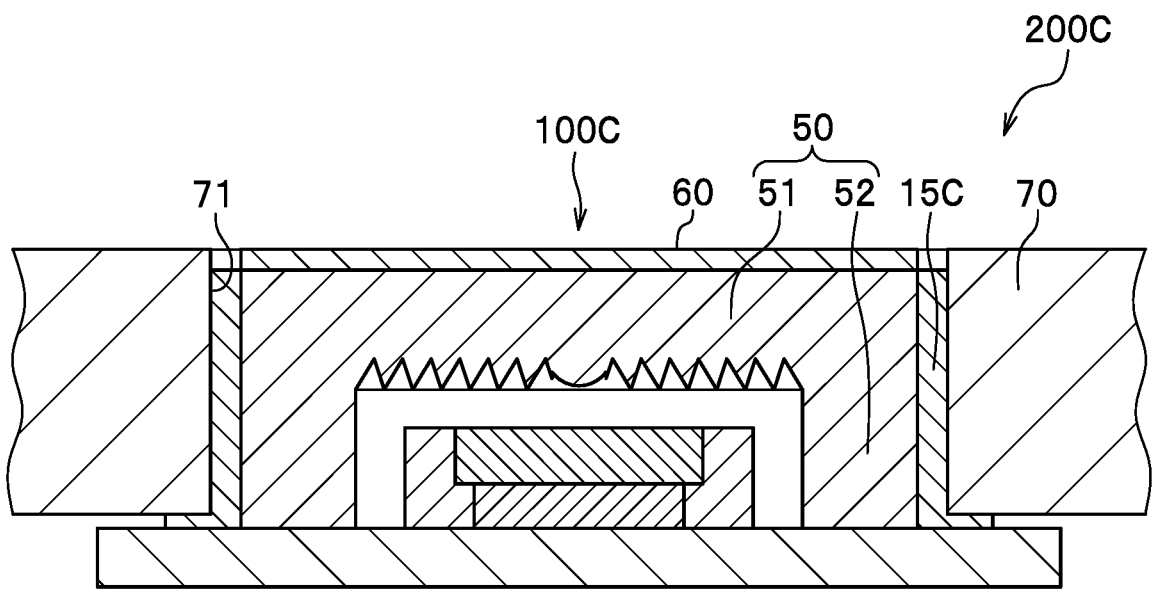
FIG. 15 is a cross-sectional view schematically illustrating the configuration of an illumination device according to the fourth embodiment.

FIG. 15 is a cross-sectional view schematically illustrating the configuration of an illumination device according to the fourth embodiment.

An illumination device 200C according to the fourth embodiment includes the above-described light-emitting device 100C and a counterpart member constituted by the casing 70 having the through-hole 71. The light-emitting device 100C is fixed to the casing 70 of the illumination device 200C by the fixing member 15C of the light-emitting device 100C being in contact with the inner surface of the through-hole 71 of the casing 70 in a state of being deformed. Although the fixing member 15C is provided over the entirety of the outer lateral surface of the sidewall 52 of the cover 50, the fixing member 15C is deformed only at the portion thereof that is in contact with the inner surface of the through-hole 71 of the casing 70.

The illumination device 200C is substantially the same as or similar to the illumination device 200 according to the first embodiment except that the above-described light-emitting device 100C is used in place of the light-emitting device 100.

Method for Manufacturing Illumination Device

Next, a description will be given of an example of a method for manufacturing the illumination device 200C.

The method for manufacturing the illumination device 200C is substantially the same as or similar to the method for manufacturing the illumination device 200 according to the first embodiment except that the light-emitting device 100C provided by the above-described method for manufacturing the light-emitting device 100C is used in place of the light-emitting device 100.

In the foregoing description, the light-emitting devices, the illumination devices, and the methods for manufacturing them have been specifically described with reference to the embodiments of the inventions. However, the scope of the present invention is not limited thereto and should be construed broadly on the basis of the scope of claims. In addition, various modifications and variations made on the basis of the above description are also included in the scope of the present invention.

OTHER EMBODIMENT

Figure 16:
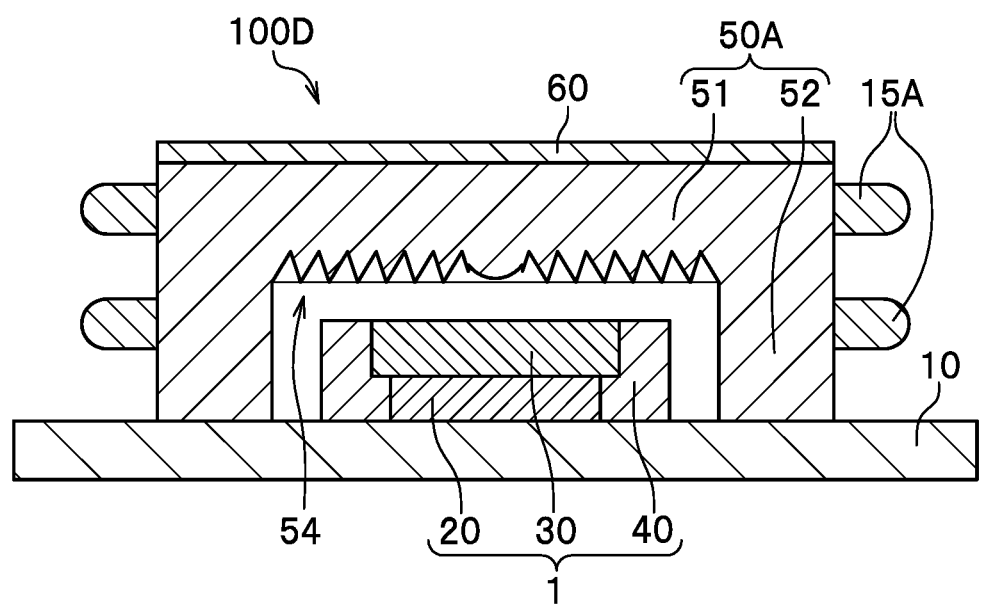
FIG. 16 is a cross-sectional view schematically illustrating the configuration of a light-emitting device according to another embodiment.

FIG. 16 is a cross-sectional view schematically illustrating the configuration of a light-emitting device according to another embodiment.

A light-emitting device 100D has two loop-shaped fixing members 15A arranged side-by-side in the height direction of the sidewall 52. With this configuration, the light-emitting device 100D can be more stably engaged with the casing. More in general, the light-emitting device and the illumination device may have a plurality of loop-shaped fixing members 15A arranged side-by-side in the height direction of the sidewall 52.

Incidentally, when a plurality of fixing members 15A are to be arranged, it is preferable that at least one of the plurality of fixing members 15A is disposed at such a height position relative to the height of the sidewall 52 that (i) the height position is lower than an uppermost area extending downward from the upper end of the outer lateral surface of the sidewall 52 by a length of 10% of the height of the sidewall 52, and (ii) the height position is higher than a lowermost area extending upward from the lower end of the outer lateral surface of the sidewall 52 by a length of 10% of the height of the sidewall 52. Moreover, it is more preferable that all the plurality of fixing members 15A are each disposed at a height position lower than the uppermost area by a length of 10% of the height of the sidewall 52 and higher than the lowermost area by a length of 10% of the height of the sidewall 52. With this configuration, the light-emitting device is easily engaged with the casing in a stable manner.

Alternatively, a plurality of loop-shaped fixing members, each of which is like the fixing member 15 illustrated in FIG. 1C, may be arranged side-by-side in the height direction of the sidewall 52. Still alternatively, a plurality of projected portions each of which is like the loop-shaped projected portion 53 illustrated in FIG. 10B may be arranged side-by-side in the height direction of the sidewall 52. In this case, a plurality of the loop-shaped fixing members each of which is like the fixing member 15B is formed side-by-side in the height direction of the sidewall 52 so that each of the fixing members covers or encapsulates a respective one of the projected portions.

Moreover, for example, the light-emitting device and/or the light-emitting device of the illumination device may or may not be provided with the hard-coat layer. Moreover, the light-emitting device and/or the light-emitting device of the illumination device may or may not be provided with the light-reflective member.

The method of manufacturing the light-emitting device and the method of manufacturing the illumination device may include another step or other steps between two of, or before or after one of the above-described steps, so long as the another step or the other steps do not adversely affect the above-described steps. For example, a step of removing foreign matter mixed in the process of manufacturing may be inserted in the process steps.

It should be noted that some of the steps of the method for manufacturing the light-emitting device and the method of manufacturing the illumination device are not limited to the order as described. The order in which they are carried out may be changed. For example, the cover and fixing member fabrication step and the cover fabrication step may be carried out after the light-transmissive member disposing step, after the light-emitting element mounting step, or after the light-reflective member forming step. In addition, the hard-coat layer forming step may be carried out after the light-transmissive member disposing step, after the light-emitting element mounting step, after the light-reflective member forming step, or after the cover disposing step.

The light-emitting devices and the illumination devices according to the embodiments described above can be used for lighting purposes, for example, for flashlight light sources or the like of mobile phones and cameras.

What is claimed is:

1. A method for manufacturing a light-emitting device, the method comprising steps of:
    forming a cover, which comprises:
        sandwiching a fixing member by a molding device,
        injecting a light-transmissive material into a space defined in the molding device, and
        hardening or curing the injected light-transmissive material,
        wherein the formed cover comprises an upper portion, a sidewall extending along a peripheral edge of the upper portion, and a recess defined by the upper portion and the sidewall, the cover being integrated with the fixing member such that the fixing member projects from a part of an outer lateral surface of the sidewall;
    disposing a light-transmissive member on a light extraction surface of a light-emitting element to be disposed on a substrate; and
    disposing the cover so that the light-emitting element is housed in the recess,
    wherein the fixing member is formed of a material that is deformable due to a pressing force generated upon engagement of the fixing member with a counterpart member.

2. A method for manufacturing an illumination device, the method comprising steps of:
    manufacturing a light-emitting device in accordance with the method of claim 1, and
    fixing the light-emitting device to a casing having a through-hole and constituting the counterpart member so that the fixing member of the light-emitting device comes into contact with an inner surface of the through-hole of the casing in a state of being deformed.

3. A method for manufacturing a light-emitting device, the method comprising steps of:
    forming a cover, which comprises:
        injecting a light-transmissive material into a space defined in a molding device, and
        hardening or curing the injected light-transmissive material,
        wherein the formed cover comprises an upper portion, a sidewall extending along a peripheral edge of the upper portion, and a recess defined by the upper portion and the sidewall;
    disposing a fixing member on an outer lateral surface of the sidewall such that the fixing member projects from a part of the outer lateral surface of the sidewall;
    disposing a light-transmissive member on a light extraction surface of a light-emitting element to be disposed on a substrate; and
    disposing the cover so that the light-emitting element is housed in the recess,
    wherein the fixing member is formed of a material that is deformable due to a pressing force generated upon engagement of the fixing member with a counterpart member.

4. The method of claim 3,
    wherein the step of forming the cover comprises forming a projected portion on the part of the outer lateral surface of the sidewall, and
    wherein in the step of disposing the fixing member, the fixing member is disposed so that the fixing member covers the projected portion.

5. The method of claim 4,
    wherein the fixing member is provided in advance, and
    wherein the step of disposing the fixing member comprises inserting the projected portion into the fixing member to fix the fixing member to the outer lateral surface of the sidewall.

6. The method of claim 3,
    wherein the step of disposing the fixing member comprises placing the cover in a molding device and forming the fixing member on the outer lateral surface of the sidewall by injection molding, transfer molding, or compression molding.

7. A method for manufacturing a light-emitting device, the method comprising steps of:
    forming a cover, which comprises:
        injecting a light-transmissive material into a space defined in a molding device, and
        hardening or curing the injected light-transmissive material,
        wherein the formed cover comprises an upper portion, a sidewall extending along a peripheral edge of the upper portion, and a recess defined by the upper portion and the sidewall;
    disposing a fixing member so as to cover an outer lateral surface of the sidewall;
    disposing a light-transmissive member on a light extraction surface of a light-emitting element to be disposed on a substrate; and
    disposing the cover so that the light-emitting element is housed in the recess,
    wherein the fixing member is formed of a material that is deformable due to a pressing force generated upon engagement of the fixing member with a counterpart member.

* * * * *